US012525450B2

(12) United States Patent
Yamamoto et al.

(10) Patent No.: US 12,525,450 B2
(45) Date of Patent: Jan. 13, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Ryuji Yamamoto, Tokyo (JP); Kimihiko Nakatani, Toyama (JP); Yoshitomo Hashimoto, Toyama (JP); Takayuki Waseda, Toyama (JP); Motomu Degai, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 426 days.

(21) Appl. No.: 18/167,153

(22) Filed: Feb. 10, 2023

(65) Prior Publication Data

US 2023/0183864 A1  Jun. 15, 2023

Related U.S. Application Data

(63) Continuation of application No. PCT/JP2020/034372, filed on Sep. 10, 2020.

(51) Int. Cl.
*H01L 21/02* (2006.01)
*C23C 16/34* (2006.01)
(Continued)

(52) U.S. Cl.
CPC ........ *H01L 21/0228* (2013.01); *C23C 16/345* (2013.01); *C23C 16/401* (2013.01); *C23C 16/45544* (2013.01); *C23C 16/45553* (2013.01)

(58) Field of Classification Search
None
See application file for complete search history.

(56) References Cited

U.S. PATENT DOCUMENTS

2017/0256402 A1  9/2017  Kaufman-Osborn et al.
2018/0053659 A1  2/2018  Chakraborty et al.
(Continued)

FOREIGN PATENT DOCUMENTS

CN   111512430 A    8/2020
JP   2013243193 A   12/2013
(Continued)

OTHER PUBLICATIONS

Machine Translation, WO '785 (Year: 2019).*
(Continued)

*Primary Examiner* — Michael G Miller
(74) *Attorney, Agent, or Firm* — Volpe Koenig

(57) ABSTRACT

There is provided a technique that includes: supplying a film formation inhibition gas to the substrate, which includes a first base and a second base on a surface of the substrate, to form a film formation inhibition layer on a surface of the first base; supplying a film-forming gas to the substrate after forming the film formation inhibition layer on the surface of the first base, to form a film on a surface of the second base; and supplying a halogen-free substance, which chemically reacts with the film formation inhibition layer and the film, to the substrate after forming the film on the surface of the second base, in a non-plasma atmosphere.

19 Claims, 9 Drawing Sheets

(51) Int. Cl.
   *C23C 16/40*     (2006.01)
   *C23C 16/455*    (2006.01)

(56)                    References Cited

U.S. PATENT DOCUMENTS

2018/0269058 A1   9/2018   Smith et al.
2019/0157101 A1   5/2019   Kaufman-Osborn et al.
2019/0198318 A1   6/2019   Bhuyan et al.

FOREIGN PATENT DOCUMENTS

JP       2018512504 A        5/2018
JP       2018164079 A       10/2018
JP       2019512877 A        5/2019
KR    10-2020-0091945 A      7/2020
WO       2016138284 A1       9/2016
WO       2017151639 A1       9/2017
WO    WO-2019023001 A1 *     1/2019   ........... H01L 21/306
WO    WO-2019229785 A1 *    12/2019   ............. H01L 21/31
WO    WO-2020016915 A1 *     1/2020   ......... H01L 21/0228

OTHER PUBLICATIONS

Machine Translation WO '915 (Year: 2020).*
Chinese Office Action issued on Feb. 22, 2025 for Chinese Patent Application No. 202080102612.5.
International Search Report, PCT/JP2020/034372, mailed Nov. 17, 2020. 3 pages.
Korean Office Action issued on Mar. 20, 2024 for Korean Patent Application No. 10-2023-7004872.

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2020/034372, filed on Sep. 10, 2020, the disclosure of which is incorporated herein in its entirety by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a process of selectively growing and forming a film on a surface of a predetermined base among a plurality of types of bases exposed on a surface of a substrate (hereinafter, the process will be referred to as selective growth or selective film formation) may be performed.

In the selective growth, before selectively growing a film on a surface of a predetermined base, a film formation inhibitor may be used to form a film formation inhibition layer on the surface of the base on which the film is not intended to be grown.

However, when the film is selectively grown after the film formation inhibition layer is formed, a processing temperature (film formation temperature) during the selective growth may not be increased to suppress desorption of the film formation inhibition layer, which may deteriorate a quality of the formed film. Further, after the selective growth, a process of removing the film formation inhibition layer may be performed, which may deteriorate a productivity.

SUMMARY

The present disclosure provides a technique capable of enhancing a productivity while improving a film quality of a film formed by selective growth.

According to some embodiments of the present disclosure, there is provided a technique that includes: (a) supplying a film formation inhibition gas to the substrate, which includes a first base and a second base on a surface of the substrate, to form a film formation inhibition layer on a surface of the first base; (b) supplying a film-forming gas to the substrate after forming the film formation inhibition layer on the surface of the first base, to form a film on a surface of the second base; and (c) supplying a halogen-free substance, which chemically reacts with the film formation inhibition layer and the film, to the substrate after forming the film on the surface of the second base, in a non-plasma atmosphere.

BRIEF DESCRIPTION OF DRAWINGS

The accompanying drawings, which are incorporated in and constitute a portion of the specification, illustrate embodiments of the present disclosure.

FIG. 5A is a partially enlarged cross-sectional view of the surface of the wafer from which a first base and a second base are exposed. FIG. 5B is a partially enlarged cross-sectional view of the surface of the wafer after a film formation inhibition layer is formed on a surface of the first base by supplying a film formation inhibition gas to the wafer. FIG. 5C is a partially enlarged cross-sectional view of the surface of the wafer after a film is formed on a surface of the second base by supplying a film-forming gas to the wafer. FIG. 5D is a partially enlarged cross-sectional view of the surface of the wafer after the film formation inhibition layer formed on the surface of the first base is removed from the surface of the first base by supplying a halogen-free substance to the wafer, and a film formed on the surface of the second base is changed into a film that is more improved in a film quality than the film formed on the surface of the second base.

FIGS. 6A to 6C are partially enlarged cross-sectional views similar to FIGS. 5A to 5C, respectively. FIG. 6D is a partially enlarged cross-sectional view of the surface of the wafer after a film formation inhibition layer formed on a surface of a first base is removed from the surface of the first base by supplying halogen-free substance to the wafer, and a composition ratio of a film formed on a surface of a second base is changed to change the film formed on the surface of the second base into a film that is different in a composition ratio from the film formed on the surface of the second base.

FIGS. 7A to 7C are partially enlarged cross-sectional views similar to FIGS. 5A to 5C, respectively. FIG. 7D is a partially enlarged cross-sectional view of the surface of the wafer after a film formation inhibition layer formed on a surface of a first base is removed from the surface of the first base by supplying halogen-free substance to the wafer, and an additional element not contained in a film formed on a surface of a second base is added to the film formed on the surface of the second base to change the film formed on the surface of the second base into a film obtained by adding the additional element to the film formed on the surface of the second base.

FIGS. 8A to 8C are partially enlarged cross-sectional views similar to FIGS. 5A to 5C, respectively. FIG. 8D is a partially enlarged cross-sectional view of the surface of the wafer after a film formation inhibition layer formed on a surface of a first base is removed from the surface of the first base by supplying halogen-free substance to the wafer, and a film formed on a surface of a second base is changed into a film that is different in chemical structure from the film formed on the surface of the second base.

FIGS. 9A to 9C are partially enlarged cross-sectional views similar to FIGS. 5A to 5C, respectively. FIG. 9D is a partially enlarged cross-sectional view of the surface of the wafer after a film formation inhibition layer formed on a surface of a first base is removed from the surface of the first base by supplying halogen-free substance to the wafer, and a surface layer which is a portion of a film formed on a surface of a second base is changed into a film that is different in chemical structure from the film formed on the surface of the second base.

DETAILED DESCRIPTION

Figure 1:
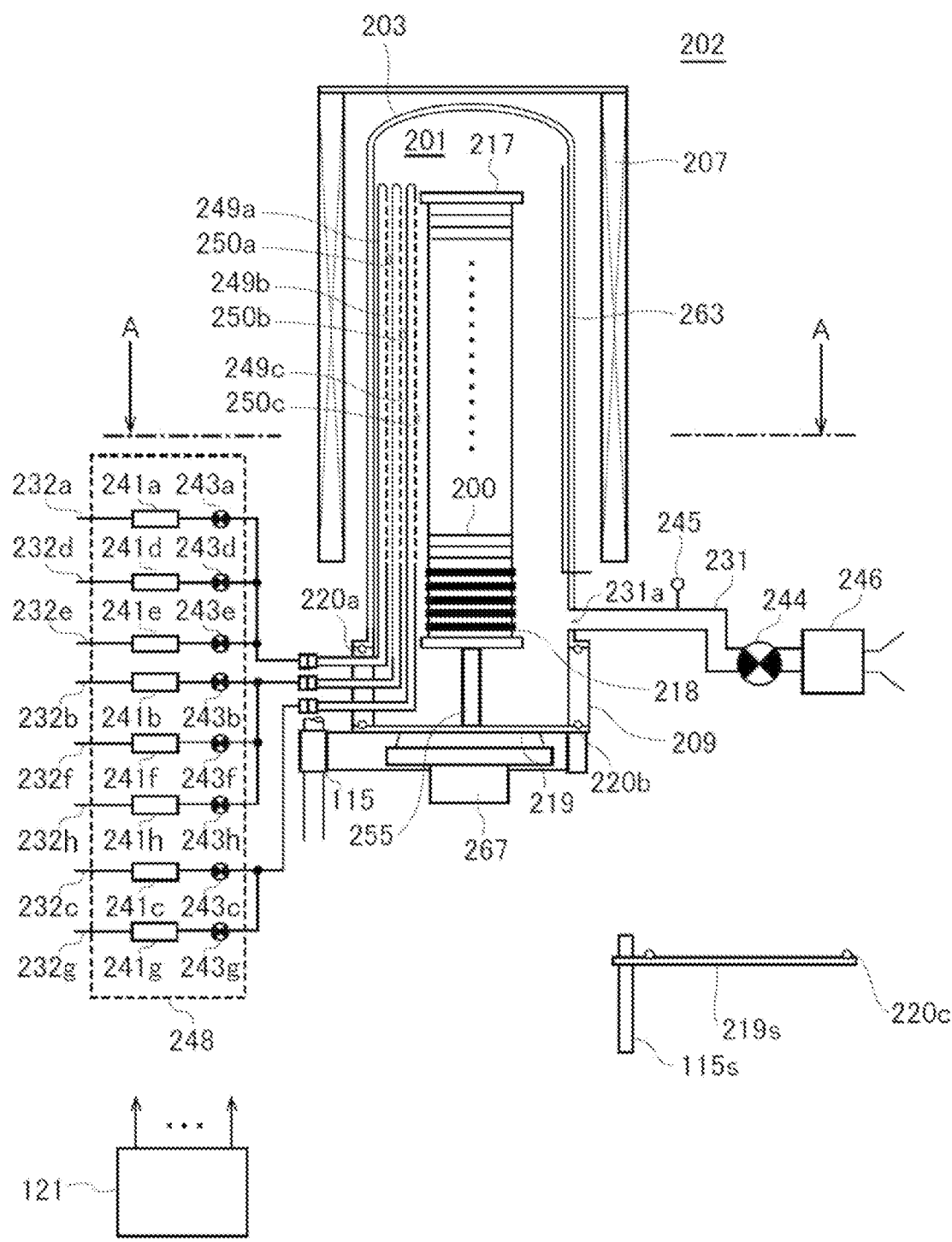
FIG. 1 is a schematic structure diagram of a vertical process furnace of a substrate processing apparatus suitably used in some embodiments of the present disclosure, in which a portion of the process furnace is illustrated in a vertical cross-sectional view.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not been described in detail so as not to obscure aspects of the various embodiments.

Embodiments of the Present Disclosure

Hereinafter, some embodiments of the present disclosure will be described mainly with reference to FIGS. 1 to 4 and 5A to 5D. The drawings used in the following description are schematic. Dimensional relationships, ratios, and the like of the respective components illustrated in the drawings may not match actual ones. Further, even among the drawings, dimensional relationships, ratios, and the like of the respective components may not match one another.

(1) Structure of Substrate Processing Apparatus

As shown in FIG. 1, a process furnace 202 includes a heater 207 as a temperature regulator (heating part). The heater 207 is formed in a cylindrical shape and is vertically installed by being supported by a holding plate. The heater 207 also functions as an activator (exciter) that activates (excites) a gas with heat.

Inside the heater 207, a reaction tube 203 is arranged concentrically with the heater 207. The reaction tube 203 is made of, for example, heat-resistant material such as quartz ($SiO_2$) or silicon carbide (SiC) and is formed in a cylindrical shape with an upper end thereof closed and a lower end thereof opened. Below the reaction tube 203, a manifold 209 is arranged concentrically with the reaction tube 203. The manifold 209 is made of, for example, metallic material such as stainless steel (SUS) and is formed in a cylindrical shape with upper and lower ends thereof opened. The upper end of the manifold 209 is engaged with the lower end of the reaction tube 203 and is configured to support the reaction tube 203. An O-ring 220a as a seal is provided between the manifold 209 and the reaction tube 203. The reaction tube 203 is installed vertically in the same manner as the heater 207. A process container (reaction container) mainly includes the reaction tube 203 and the manifold 209. A process chamber 201 is formed in a hollow portion of the process container. The process chamber 201 is configured to be capable of accommodating wafers 200 as substrates. The wafers 200 are processed in the process chamber 201.

Nozzles 249a to 249c as first to third suppliers are respectively installed in the process chamber 201 to penetrate a side wall of the manifold 209. The nozzles 249a to 249c are also referred to as first to third nozzles, respectively. The nozzles 249a to 249c are made of, for example, heat-resistant material such as quartz or SiC. Gas supply pipes 232a to 232c are connected to the nozzles 249a to 249c, respectively. The nozzles 249a to 249c are different nozzles, and the nozzles 249a and 249c are respectively provided adjacent to the nozzle 249b.

At the gas supply pipes 232a to 232c, mass flow controllers (MFCs) 241a to 241c, which are flow rate controllers (flow rate control parts), and valves 243a to 243c, which are on-off valves, are respectively installed sequentially from the upstream side of gas flow. Gas supply pipes 232d and 232e are respectively connected to the gas supply pipe 232a on the downstream side of the valve 243a. Gas supply pipes 232f and 232h are respectively connected to the gas supply pipe 232b on the downstream side of the valve 243b. A gas supply pipe 232g is connected to the gas supply pipe 232c on the downstream side of the valve 243c. At the gas supply pipes 232d to 232h, MFCs 241d to 241h and valves 243d to 243h are respectively installed sequentially from the upstream side of gas flow. The gas supply pipes 232a to 232h are made of, for example, metallic material such as stainless steel (SUS).

Figure 2:
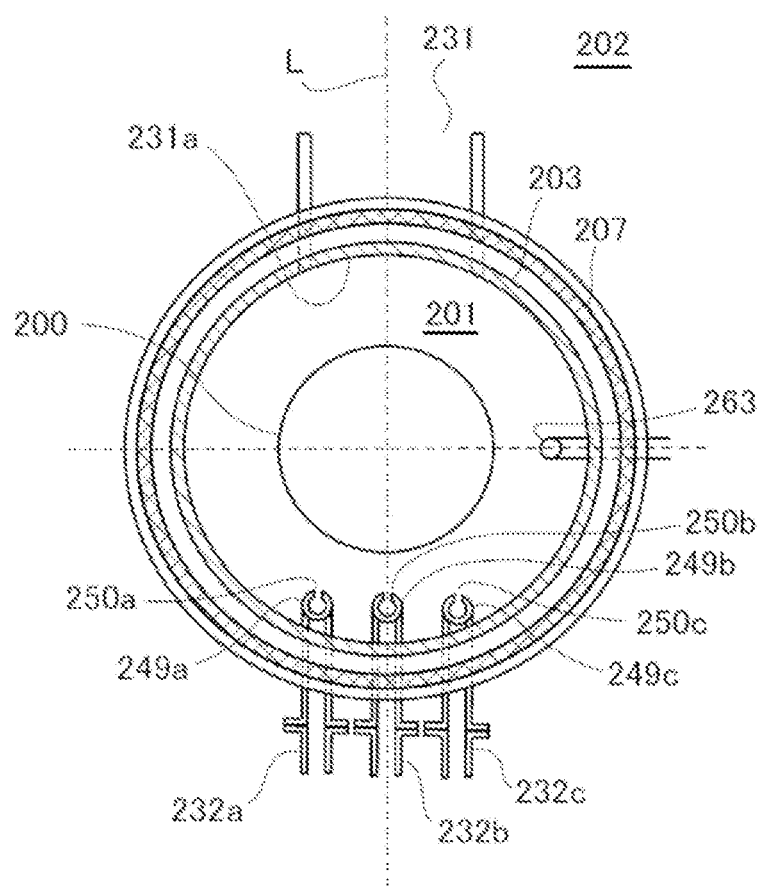
FIG. 2 is a schematic structure diagram of the vertical process furnace of the substrate processing apparatus suitably used in some embodiments of the present disclosure, in which a portion of the process furnace is illustrated in a cross-sectional view taken along line A-A in FIG. 1.

As shown in FIG. 2, the nozzles 249a to 249c are arranged in an annular space in a plane view between the inner wall of the reaction tube 203 and the wafers 200 and are installed to extend upward in an arrangement direction of the wafers 200 from the lower side to the upper side of the inner wall of the reaction tube 203, respectively. In other words, the nozzles 249a to 249c are respectively installed in a region horizontally surrounding a wafer arrangement region, in which the wafers 200 are arranged, on the lateral side of the wafer arrangement region so as to extend along the wafer arrangement region. In the plane view, the nozzle 249b is arranged to face an exhaust port 231a, which is described below, on a straight line across centers of the wafers 200 loaded into the process chamber 201. The nozzles 249a and 249c are arranged to sandwich a straight line L passing through the nozzle 249b and a center of the exhaust port 231a from both sides along the inner wall of the reaction tube 203 (outer peripheral sides of the wafers 200). The straight line L is also a straight line passing through the nozzle 249b and the center of the wafers 200. That is, the nozzle 249c may be installed on the side opposite to the nozzle 249a with the straight line L interposed therebetween. The nozzles 249a and 249c are arranged line-symmetrically with the straight line L as an axis of symmetry. Gas supply holes 250a to 250c configured to supply gases are formed on the side surfaces of the nozzles 249a to 249c, respectively. The gas supply holes 250a to 250c are respectively opened to face the exhaust port 231a in the plane view and may supply gases toward the wafers 200. The gas supply holes 250a to 250c are formed from the lower side to the upper side of the reaction tube 203.

A film formation inhibition gas is supplied from the gas supply pipe 232a into the process chamber 201 via the MFC 241a, the valve 243a, and the nozzle 249a.

A precursor gas is supplied from the gas supply pipe 232b into the process chamber 201 via the MFC 241b, the valve 243b, and the nozzle 249b.

A reaction gas is supplied from the gas supply pipe 232c into the process chamber 201 via the MFC 241c, the valve 243c, and the nozzle 249c. Since the reaction gas may contain a substance that acts as halogen-free substance, which is described below, the halogen-free substance may be supplied into the process chamber 201 via the MFC 241c, the valve 243c, and the nozzle 249c.

A catalyst gas is supplied from the gas supply pipe 232d into the process chamber 201 via the MFC 241d, the valve 243d, the gas supply pipe 232a, and the nozzle 249a.

An inert gas is supplied from the gas supply pipes 232e to 232g into the process chamber 201 via the MFCs 241e to 241g, the valves 243e to 243g, the gas supply pipes 232a to 232c, and the nozzles 249a to 249c.

The halogen-free substance is supplied from the gas supply pipe 232h into the process chamber 201 via the MFC 241h, the valve 243h, the gas supply pipe 232b, and the nozzle 249b.

A film formation inhibition gas supply system mainly includes the gas supply pipe 232a, the MFC 241a, and the valve 243a. A precursor gas supply system mainly includes the gas supply pipe 232b, the MFC 241b, and the valve 243b. A reaction gas supply system mainly includes the gas supply pipe 232c, the MFC 241c, and the valve 243c. A catalyst gas supply system mainly includes the gas supply pipe 232d, the MFC 241d, and the valve 243d. An inert gas supply system mainly includes the gas supply pipes 232e to 232g, the MFCs 241e to 241g, and the valves 243e to 243g. A halogen-free substance supply system mainly includes the gas supply pipe 232h, the MFC 241h, and the valve 243h.

Since the precursor gas, the reaction gas, and the catalyst gas act as film-forming gases, the precursor gas supply system, the reaction gas supply system, and the catalyst gas supply system may also be referred to as a film-forming gas supply system. Further, since the reaction gas may act as the halogen-free substance in some cases, the reaction gas supply system may also be referred to as a halogen-free substance supply system. That is, the gas supply pipe 232c, the MFC 241c, and the valve 243c may constitute a halogen-free substance supply system.

Among the various supply systems described above, any one or the entirety of the supply systems may be constituted as an integrated supply system 248 in which the valves 243a to 243h, the MFCs 241a to 241h, and the like are integrated. The integrated supply system 248 is connected to each of the gas supply pipes 232a to 232h, and is configured such that an operation of supplying various gases into the gas supply pipes 232a to 232h, i.e., an opening/closing operation of the valves 243a to 243h, a flow rate regulating operation by the MFCs 241a to 241h, and the like are controlled by a controller 121 described below. The integrated supply system 248 is configured as an integral type or division type integrated unit and may be attached to or detached from the gas supply pipes 232a to 232h on an integrated unit basis. Maintenance, replacement, expansion, and the like of the integrated supply system 248 may be performed on an integrated unit basis.

An exhaust port 231a configured to exhaust an atmosphere in the process chamber 201 is provided at the lower side of the side wall of the reaction tube 203. As shown in FIG. 2, the exhaust port 231a is provided at a position facing the nozzles 249a to 249c (gas supply holes 250a to 250c) with the wafers 200 interposed therebetween in the plane view. The exhaust port 231a may be provided to extend from the lower side to the upper side of the side wall of the reaction tube 203, i.e., along the wafer arrangement region. An exhaust pipe 231 is connected to the exhaust port 231a. A vacuum pump 246 as a vacuum exhauster is connected to the exhaust pipe 231 via a pressure sensor 245 as a pressure detector (pressure detection part) configured to detect the pressure inside the process chamber 201 and an APC (Auto Pressure Controller) valve 244 as a pressure regulator (pressure regulation part). The APC valve 244 is configured to be capable of performing or stopping vacuum exhaust of the interior of the process chamber 201 by being opened and closed while the vacuum pump 246 is operated. Further, the APC valve 244 is configured to be capable of regulating the pressure inside the process chamber 201 by adjusting a valve opening state based on the pressure information detected by the pressure sensor 245 while the vacuum pump 246 is operated. An exhaust system mainly includes the exhaust pipe 231, the APC valve 244, and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of, for example, metallic material such as stainless steel (SUS), and is formed in a disc shape. An O-ring 220b as a seal, which comes into contact with the lower end of the manifold 209, is installed on the upper surface of the seal cap 219. A rotator 267 configured to rotate a boat 217 described below is installed below the seal cap 219. A rotating shaft 255 of the rotator 267 is connected to the boat 217 through the seal cap 219. The rotator 267 is configured to rotate the wafers 200 by rotating the boat 217. The seal cap 219 is configured to be raised or lowered in the vertical direction by a boat elevator 115 as an elevator installed outside the reaction tube 203. The boat elevator 115 is constituted as a transfer apparatus (transfer mechanism) that loads or unloads (transfers) the wafers 200 into or out of the process chamber 201 by raising or lowering the seal cap 219.

Below the manifold 209, a shutter 219s is installed as a furnace opening lid capable of airtightly closing the lower end opening of the manifold 209 while the seal cap 219 is lowered and the boat 217 is unloaded from the process chamber 201. The shutter 219s is made of, for example, metallic material such as stainless steel (SUS) and is formed in a disc shape. An O-ring 220c as a seal, which comes into contact with the lower end of the manifold 209, is installed on the upper surface of the shutter 219s. The opening/closing operations (the elevating operation, the rotating operation, and the like) of the shutter 219s are controlled by a shutter opening/closing mechanism 115s.

A boat 217 serving as a substrate support is configured to support a plurality of wafers 200, for example, 25 to 200 wafers in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of, for example, heat-resistant material such as quartz or SiC. Heat insulating plates 218 made of, for example, heat-resistant material such as quartz or SiC, are supported in multiple stages at the bottom of the boat 217.

A temperature sensor 263 as a temperature detector is installed in the reaction tube 203. By regulating a state of supplying electric power to the heater 207 based on the temperature information detected by the temperature sensor 263, a temperature distribution inside the process chamber 201 becomes a desired temperature distribution. The temperature sensor 263 is installed along the inner wall of the reaction tube 203.

Figure 3:
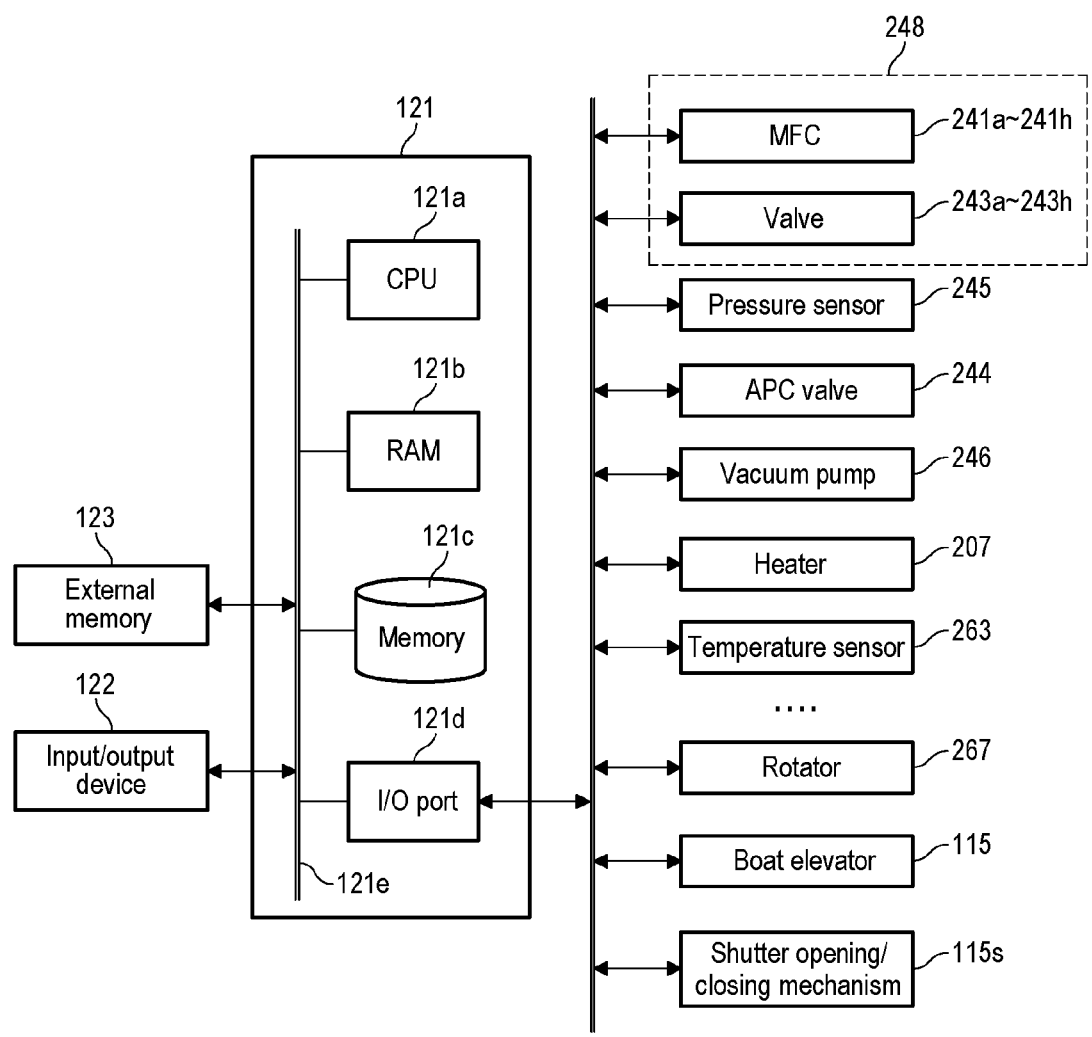
FIG. 3 is a schematic structure diagram of a controller of a substrate processing apparatus suitably used in some embodiments of the present disclosure, in which a control system of the controller is illustrated in a block diagram.

As shown in FIG. 3, the controller 121 as a control part (control means or unit) is constituted as a computer including a CPU (Central Processing Unit) 121a, a RAM (Random Access Memory) 121b, a memory 121c, and an I/O port 121d. The RAM 121b, the memory 121c, and the I/O port 121d are configured to be capable of exchanging data with the CPU 121a via an internal bus 121e. An input/output device 122 including, for example, a touch panel or the like is connected to the controller 121.

The memory 121c includes, for example, a flash memory, a HDD (Hard Disk Drive), a SSD (Solid State Drive), or the like. A control program that controls the operation of the substrate processing apparatus, a process recipe in which procedures, conditions, and the like of substrate processing to be described below are written, and the like are readably stored in the memory 121c. The process recipe functions as a program configured to be capable of causing the controller 121 to execute each sequence in the substrate processing described below to obtain a predetermined result. Hereinafter, the process recipe, the control program, and the like are collectively and simply referred to as a program. Further, the process recipe is also simply referred to as a recipe. When the term "program" is used herein, it may mean a case of including the recipe, a case of including the control program, or a case of including both the recipe and the control program. The RAM 121b is constituted as a memory area (work area) in which programs, data, and the like read by the CPU 121a are temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotator 267, the boat elevator 115, the shutter opening/closing mechanism 115s, and the like.

The CPU 121a is configured to be capable of reading and executing the control program from the memory 121c and to read the recipe from the memory 121c in response to an input of an operation command from the input/output device 122 or the like. The CPU 121a is configured to, according to the contents of the recipe thus read, control the flow rate regulating operation of various gases by the MFCs 241a to 241h, the opening/closing operations of the valves 243a to 243h, the opening/closing operation of the APC valve 244, the pressure regulating operation by the APC valve 244 based on the pressure sensor 245, the start and stop of the vacuum pump 246, the temperature regulating operation of the heater 207 based on the temperature sensor 263, the rotation and the rotation speed adjustment operation of the boat 217 by the rotator 267, the raising or lowering operation of the boat 217 by the boat elevator 115, the opening/closing operation of the shutter 219s by the shutter opening/closing mechanism 115s, and the like.

The controller 121 may be configured by installing, in the computer, the above-described program stored in an external memory 123. The external memory 123 includes, for example, a magnetic disc such as a HDD, an optical disc such as a CD, a magneto-optical disc such as a MO, a semiconductor memory such as a USB memory and a SSD, and so forth. The memory 121c and the external memory 123 are constituted as a computer readable recording medium. Hereinafter, the memory 121c and the external memory 123 are collectively and simply referred to as a recording medium. As used herein, the term "recording medium" may include the memory 121c, the external memory 123, or both. The program may be provided to the computer by using a communication means or unit such as the Internet or a dedicated line instead of using the external memory 123.

(2) Substrate Processing Process

As a process of manufacturing a semiconductor device by using the above-described substrate processing apparatus, an example of a processing sequence of selective growth (selective film formation) in which a film is selectively grown and formed on a surface of a predetermined base among a plurality of types of bases exposed on a surface of a wafer 200 as a substrate will be described mainly with reference to FIGS. 4 and 5A to 5D. In the following description, an operation of each component constituting the substrate processing apparatus is controlled by the controller 121.

Figure 4:
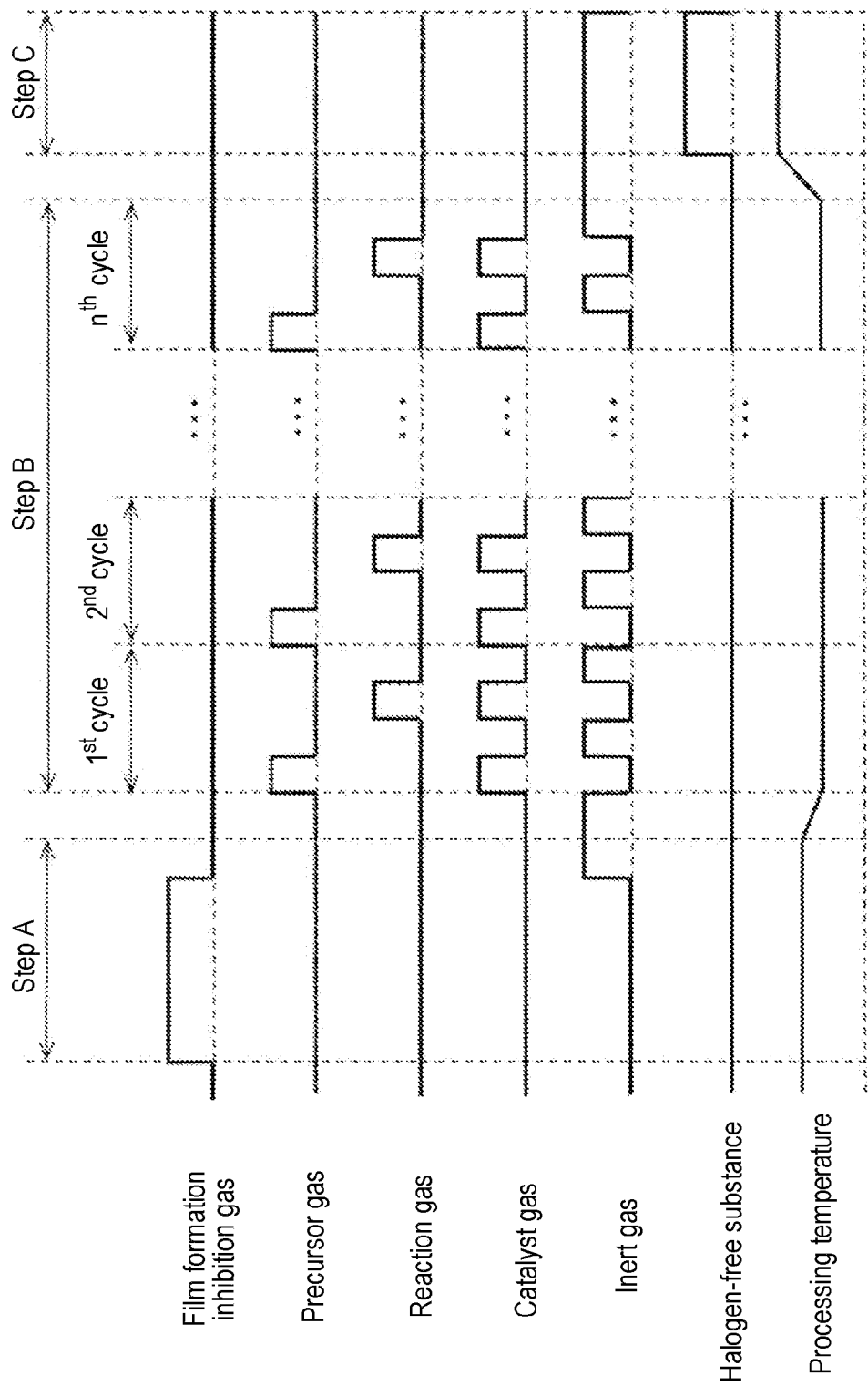
FIG. 4 is a diagram showing a processing sequence in selective growth according to some embodiments of the present disclosure.

A processing sequence shown in FIG. 4 includes performing:

Step A of supplying a film formation inhibition gas to a wafer 200, which includes a base 200a as a first base and a base 200b as a second base exposed on a surface of the wafer 200, to form a film formation inhibition layer 310 on a surface of the base 200a;

Step B of supplying a film-forming gas (precursor gas, reaction gas, or catalyst gas) to the wafer 200 after forming the film formation inhibition layer 310 on the surface of the base 200a, to form a film 320 on a surface of the base 200b; and Step C of supplying a halogen-free substance, which chemically reacts with the film formation inhibition layer 310 and the film 320, to the wafer 200 after forming the film 320 on the surface of the base 200b, in a non-plasma atmosphere.

Step A is also referred to as film formation inhibition layer formation. Step B is also referred to as selective growth. Step C is also referred to as post-treatment. The film-forming gas used in Step B includes a precursor gas, a reaction gas, and a catalyst gas as described above.

In the processing sequence shown in FIG. 4, in Step B, the precursor gas, the reaction gas, and the catalyst gas are respectively supplied to the wafer 200 as film-forming gases. Specifically, in Step B, a cycle including non-simultaneously performing a step of supplying the precursor gas and the catalyst gas to the wafer 200 and a step of supplying the reaction gas and the catalyst gas to the wafer 200 is performed a predetermined number of times (n times where n is an integer of 1 or more) to form the film on the surface of the base 200b.

In the processing sequence shown in FIG. 4, the temperature of the wafer 200 in Step B is set to be equal to or lower than the temperature of the wafer 200 in Step A, specifically lower than the temperature of the wafer 200 in Step A. Further, in the processing sequence shown in FIG. 4, the temperature of the wafer 200 in Step C is set to be equal to or higher than the temperature of the wafer 200 in Step B, specifically higher than the temperature of the wafer 200 in Step B. Further, in the processing sequence shown in FIG. 4, the temperature of the wafer 200 in Step C is set to be equal to or higher than the temperature of the wafer 200 in Step A, specifically higher than the temperature of the wafer 200 in Step A.

In the present disclosure, for the sake of convenience, the processing sequence described above may be denoted as follows. The same applies to the following description of other embodiments, modifications, and the like.

Film formation inhibition gas→(precursor gas+catalyst gas→reaction gas+catalyst gas)×n→halogen-free substance The term "wafer" used herein may refer to "a wafer itself" or "a stacked body of a wafer and a predetermined layer or film formed on a surface of the wafer." The phrase "a surface of a wafer" used herein may refer to "a surface of a wafer itself" or "a surface of a predetermined layer or the like formed on a wafer." The expression "a predetermined layer is formed on a wafer" used herein may mean that "a predetermined layer is directly formed on a surface of a wafer itself" or that "a predetermined layer is formed on a layer or the like formed on a wafer." The term "substrate" used herein may be synonymous with the term "wafer."

(Wafer Charging and Boat Loading)

After a plurality of wafers 200 is charged to the boat 217 (wafer charging), the shutter 219s is moved by the shutter opening/closing mechanism 115s to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b.

Figure 5A:
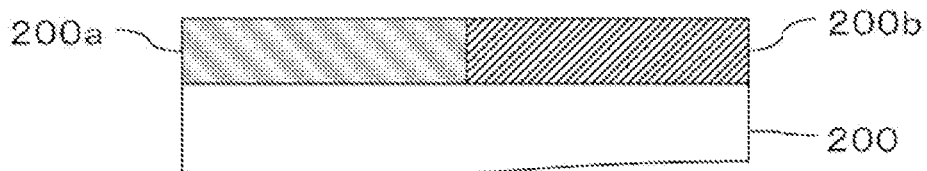
FIGS. 5A to 5D are partially enlarged cross-sectional views of a surface of a wafer at the respective steps of selective growth according to some embodiments of the present disclosure.

As shown in FIG. 5A, on the surface of the wafer 200 charged to the boat 217, a plurality of types of bases, for example, an base 200a including a silicon oxide film (SiO film) as an oxygen (O)-containing film, i.e., an oxide film, and an base 200b including a silicon nitride film (SiN film) as a nitride film which is an O-free film, i.e., a non-oxide film, are exposed in advance. The base 200a includes a surface terminated with hydroxyl groups (OH groups) over the entire region (entire surface). That is, the base 200a contains OH terminations over the entire region (entire surface) thereof. On the other hand, the base 200b includes a surface in which many regions are not terminated with OH groups, i.e., a surface in which some regions are terminated with OH groups.

(Pressure Regulation and Temperature Regulation)

Thereafter, the inside of the process chamber 201, i.e., a space where the wafer 200 is placed, is vacuum-exhausted (decompression-exhausted) by the vacuum pump 246 such that a pressure inside the process chamber 201 becomes a desired pressure (state of vacuum). In this operation, the pressure inside the process chamber 201 is measured by the pressure sensor 245, and the APC valve 244 is feedback-controlled based on the measured pressure information. Further, the wafer 200 in the process chamber 201 is heated by the heater 207 such that the temperature of the wafer 200 reaches a desired processing temperature. At this time, a state of supplying electric power to the heater 207 is feedback-controlled based on the temperature information detected by the temperature sensor 263 such that a temperature distribution inside the process chamber 201 becomes a desired temperature distribution. Further, rotation of the wafer 200 by the rotator 267 is started. The exhaust of the inside of the process chamber 201 and the heating and rotation of the wafer 200 are continuously performed at least until the processing on the wafer 200 is completed.

Thereafter, Step A, Step B, and Step C are executed in this order. These steps will be described below.

[Step A (Film Formation Inhibition Layer Formation)]

In Step A, the film formation inhibition gas is supplied to the wafer 200 in the process chamber 201, that is, the wafer 200 including the base 200a and the base 200b exposed on the surface thereof, to form the film formation inhibition layer 310 on the surface of the base 200a.

Specifically, the valve 243a is opened to supply the film formation inhibition gas into the gas supply pipe 232a. A flow rate of the film formation inhibition gas is regulated by the MFC 241a. The film formation inhibition gas is supplied into the process chamber 201 via the nozzle 249a, and is exhausted via the exhaust port 231a. At this time, the film formation inhibition gas is supplied to the wafer 200. At this time, the valves 243e to 243g may be opened to supply the inert gas into the process chamber 201 via the nozzles 249a to 249c, respectively.

Figure 5B:
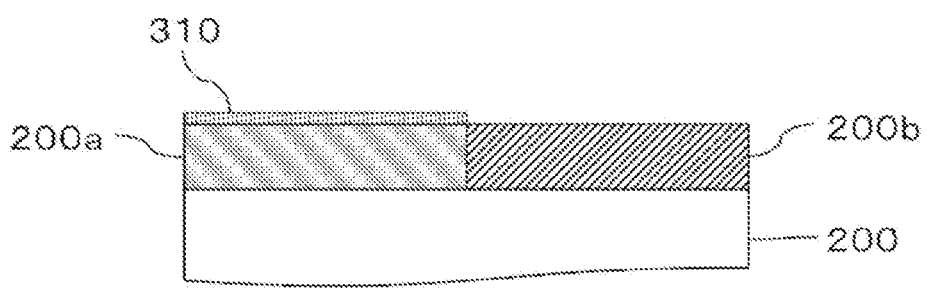

By supplying the film formation inhibition gas to the wafer 200 under a processing condition to be described below, as shown in FIG. 5B, the film formation inhibition gas may be selectively (preferentially) chemisorbed on the surface of the base 200a of the bases 200a and 200b to selectively (preferentially) form the film formation inhibition layer 310 on the surface of the base 200a. The film formation inhibition layer 310 thus formed contains, for example, hydrocarbon group terminations. In Step B to be described below, the film formation inhibition layer 310 acts as a film formation inhibitor (adsorption inhibitor), i.e., an inhibitor that suppresses the adsorption of the film-forming gases (the precursor gas, the reaction gas, etc.) on the surface of the base 200a and a reaction between the surface of the base 200a and the film-forming gases (the precursor gas, the reaction gas, etc.), thus suppressing a progress of the film-forming reaction on the surface of the base 200a. The film formation inhibition layer 310 may also be referred to as an adsorption inhibition layer or a reaction inhibition layer in terms of its action.

The film formation inhibition layer 310 formed on the surface of the base 200a may also be referred to as the inhibitor, and the film formation inhibition gas itself supplied to the wafer 200 to form the film formation inhibition layer 310 may also be referred to as the inhibitor. When the term inhibitor is used herein, it may include the film formation inhibition layer 310, the film formation inhibition gas, or both of them.

After forming the film formation inhibition layer 310 on the surface of the base 200a, the supply of the film formation inhibition gas is stopped. Then, the inside of the process chamber 201 is vacuum-exhausted, and the gas and the like remaining in the process chamber 201 are removed from the inside of the process chamber 201. At this time, the inert gas is supplied into the process chamber 201 via the nozzles 249a to 249c. The inert gas supplied from the nozzles 249a to 249c acts as a purge gas, thereby purging the inside of the process chamber 201 (purging).

A processing condition when supplying the film formation inhibition gas in Step A is exemplified as follows.

Processing temperature: room temperature (25 degrees C.) to 500 degrees C., specifically room temperature to 250 degrees C.

Processing pressure: 1 to 2000 Pa, specifically 5 to 1000 Pa,

Film formation inhibition gas supply flow rate: 1 to 3000 sccm, specifically 1 to 500 sccm Film formation inhibition gas supply time: 1 second to 120 minutes, specifically 30 seconds to 60 minutes, and Inert gas supply flow rate (per gas supply pipe): 0 to 20000 sccm.

A processing condition when performing the purging in Step A is exemplified as follows.

Processing temperature: room temperature (25 degrees C.) to 500 degrees C., specifically room temperature to 250 degrees C., Processing pressure: 1 to 30 Pa, specifically 1 to 20 Pa, Inert gas supply flow rate (per gas supply pipe): 500 to 20000 sccm, and Inert gas supply time: 10 to 30 seconds.

Further, expression of a numerical range such as "1 to 2000 Pa" in the present disclosure means that a lower limit and an upper limit are included in the range. Therefore, for example, "1 to 2000 Pa" means "1 Pa or more and 2000 Pa or less." The same applies to other numerical ranges. Further, the processing temperature means the temperature of the wafer 200, and the processing pressure means the pressure inside the process chamber 201. The same applies to the following description.

Step A may be performed in a non-plasma atmosphere. By performing Step A in the non-plasma atmosphere, it is possible to avoid plasma damage to the wafer 200, the bases 200a and 200b on the surface of the wafer 200, and the film formation inhibition layer 310 formed on the surface of the base 200a in Step A.

Further, in Step A, the film formation inhibition gas may be chemisorbed on a portion of the surface of the base 200b. However, since many regions of the surface of the base 200b do not contain OH terminations, a chemisorption amount of the film formation inhibition gas on the surface of the base 200b is small, and a chemisorption amount of the film formation inhibition gas on the surface of the base 200a is overwhelmingly large.

As the film formation inhibition gas, for example, a hydrocarbon group-containing gas may be used. By using the hydrocarbon group-containing gas as the film formation inhibition gas, it is possible to form the film formation inhibition layer 310 containing hydrocarbon group terminations. The film formation inhibition layer 310 containing hydrocarbon group terminations is also referred to as a hydrocarbon group termination layer.

The hydrocarbon groups in the hydrocarbon group-containing gas may contain a single bond like an alkyl group, or may contain an unsaturated bond such as a double bond or a triple bond. As the hydrocarbon group-containing gas, for example, a gas containing an alkyl group may be used. As the gas containing the alkyl group, for example, a gas containing an alkylsilyl group in which an alkyl group is coordinated to Si, i.e., an alkylsilane-based gas may be used. The alkyl group is a general term of the remaining atomic group obtained by removing one hydrogen (H) atom from an alkane (a chain-like saturated hydrocarbon represented by the general formula $C_nH_{2n+2}$), and is a functional group represented by the general formula $C_nH_{2n+1}$. As the alkyl group, specifically, an alkyl group containing 1 to 5 carbon atoms may be used, and more specifically, an alkyl group containing 1 to 4 carbon atoms may be used. The alkyl group may be linear or branched. Examples of the alkyl group may include a methyl group, an ethyl group, a n-propyl group, a n-butyl group, an isopropyl group, an isobutyl group, a sec-butyl group, a tert-butyl group, and the like. Since the alkyl group is bonded to Si, which is a central atom of an alkylsilane molecule, the alkyl group in alkylsilane may also be referred to as a ligand or an alkyl ligand.

The hydrocarbon group-containing gas may further contain an amino group. That is, the hydrocarbon group-containing gas may contain the hydrocarbon group and the amino group. As a hydrocarbon group- and amino group-containing gas, for example, an alkylaminosilane-based gas containing an alkyl group directly bonded to Si as the central atom and an amino group directly bonded to Si as the central atom may be used. The amino group is a functional group in which one or two hydrocarbon groups are coordinated to one nitrogen (N) atom (a functional group in which one or both of hydrogen (H) atoms of an amino group represented by —$NH_2$ are substituted with hydrocarbon groups). When two hydrocarbon groups constituting a portion of the amino group are coordinated to one N atom, the two hydrocarbon groups may be the same or may be different from each other. The hydrocarbon group constituting a portion of the amino group is the same as the hydrocarbon group described above. Moreover, the amino group may contain a cyclic structure. The amino group directly bonded to Si, which is the central atom in alkylaminosilane, may also be referred to as a ligand or an amino ligand. Further, the alkyl group directly bonded to Si, which is the central atom in alkylaminosilane, may also be referred to as a ligand or an alkyl ligand.

As the alkylaminosilane-based gas, for example, an aminosilane compound gas represented by the following formula [1] may be used.

$$SiA_x[(NB_2)_{(4-x)}] \qquad [1]$$

In formula [1], A represents a hydrogen (H) atom, an alkyl group, or an alkoxy group, B represents a H atom or an alkyl group, and x represents an integer of 1 to 3. When x is 1, A represents an alkyl group, and when x is 2 or 3, at least one selected from the group of A's represents an alkyl group.

In formula [1], specifically, the alkyl group represented by A may be an alkyl group containing 1 to 5 carbon atoms, more specifically, an alkyl group containing 1 to 4 carbon atoms. The alkyl group represented by A may be linear or branched. Examples of the alkyl group represented by A include a methyl group, an ethyl group, a n-propyl group, a n-butyl group, an isopropyl group, an isobutyl group, a sec-butyl group, a tert-butyl group, and the like. The alkoxy group represented by A may be specifically an alkoxy group containing 1 to 5 carbon atoms, more specifically an alkoxy group containing 1 to 4 carbon atoms. The alkyl group in the alkoxy group represented by A is the same as the alkyl group represented by A. When x is 2 or 3, two or three A's may be the same or different from each other or one another. The alkyl group represented by B is the same as the alkyl group represented by A. Further, two B's may be the same or different from each other. When x is 1 or 2, a plurality of $(NB_2)$'s may be the same or different from each other or one another. Further, two B's may be bonded to form a cyclic structure, and the cyclic structure thus formed may further contain a substituent such as an alkyl group.

As the alkylaminosilane-based gas, for example, a gas of a compound containing one amino group and three alkyl groups in one molecule may be used. That is, a gas of a compound in which A in formula [1] is an alkyl group and x is 3 may be used. As the alkylaminosilane-based gas, an (alkylamino)alkylsilane-based gas may be used. Specifically, for example, (dialkylamino)trialkylsilane-based gases such as a (dimethylamino)trimethylsilane $((CH_3)_2NSi(CH_3)_3$, abbreviation: DMATMS) gas, a (diethylamino)trimethylsilane $((C_2H_5)_2NSi(CH_3)_3$, abbreviation: DEATMS) gas, a (diethylamino)triethylsilane $((C_2H_5)_2NSi(C_2H_5)_3$, abbreviation: DEATES) gas, a (dimethylamino)triethylsilane $((CH_3)_2NSi(C_2H_5)_3$, abbreviation: DMATES) gas, and the like may be used. Further, three alkyl groups (methyl groups or ethyl groups) as well as one amino group (dimethylamino group or diethylamino group) are bonded to Si, which is the central atom of DMATMS, DEATMS, DEATES, DMATES, or the like. That is, DMATMS, DEATMS, DEATES, DMATES, or the like contains one amino ligand and three alkyl ligands.

As the inert gas, for example, a nitrogen (N2) gas may be used. In addition, rare gases such as an argon (Ar) gas, a helium (He) gas, a neon (Ne) gas, and a xenon (Xe) gas may be used. The same applies to the respective steps to be described below.

[Step B (Selective Growth)]

After Step A is completed, Step B is performed. In Step B, film-forming gases (a precursor gas, a reaction gas, and a catalyst gas) are supplied to the wafer 200 in the process chamber 201, i.e., the wafer 200 after the film formation inhibition layer 310 is formed on the surface of the base 200a, to form a film on the surface of the base 200b.

In Step B, an output of the heater 207 is regulated such that the temperature of wafer 200 is equal to or lower than the temperature of the wafer 200 in Step A, specifically lower than the temperature of the wafer 200 in Step A.

In Step B, the precursor gas and the reaction gas may be alternately supplied to the wafer 200 as the film-forming gases, or the precursor gas and the reaction gas may alternately supplied to the wafer 200 as the film-forming gases and the catalyst gas may be supplied together with at least one selected from the group of the precursor gas and the reaction gas. An example is described below in which, in Step B, the precursor gas and the reaction gas are alternately supplied as the film-forming gases, and the catalyst gas is supplied together with each of the precursor gas and the reaction gas. Specifically, in Step B, the following Steps B1 and B2 are sequentially executed.

[Step B1]

In this step, the precursor gas and the catalyst gas are supplied to the wafer 200 in the process chamber 201, i.e., the wafer 200 after the film formation inhibition layer 310 is formed on the surface of the base 200a.

Specifically, the valves 243b and 243d are opened to supply the precursor gas into the gas supply pipe 232b and supply the catalyst gas into the gas supply pipe 232d. Flow rates of the precursor gas and the catalyst gas are regulated by MFCs 241b and 241d, respectively. The precursor gas and the catalyst gas are supplied into the process chamber 201 via the nozzles 249b and 249a, then mixed in the process chamber 201, and exhausted via the exhaust port 231a. In this operation, the precursor gas and the catalyst gas are supplied to the wafer 200 (supply of precursor gas+catalyst gas). At this time, the valves 243e to 243g may be opened to supply the inert gas into the process chamber 201 via the nozzles 249a to 249c respectively.

By supplying the precursor gas and the catalyst gas to the wafer 200 under a processing condition to be described below, it is possible to cause the precursor gas to be selectively (preferentially) chemisorbed on the surface of the base 200b while suppressing chemisorption of the precursor gas on the surface of the base 200a. Thus, a first layer is formed on the surface of the base 200b.

In this step, by supplying the catalyst gas together with the precursor gas, it is possible to cause the above-described reaction to proceed in a non-plasma atmosphere and under a low temperature condition to be described below. By forming the first layer in the non-plasma atmosphere and under the low temperature condition to be described below, it is possible to maintain molecules and atoms constituting the film formation inhibition layer 310 formed on the surface of the base 200a without extinguishing (desorbing) such molecules and atoms from the surface of the base 200a.

Further, by forming the first layer in the non-plasma atmosphere and under the low temperature condition to be described below, it is possible to prevent the precursor gas from being pyrolyzed (decomposed in a vapor phase), i.e., autolyzed in the process chamber 201, suppress multiple deposition of a portion of a structure of the precursor gas on the surfaces of the bases 200a and 200b, and cause the precursor gas to be selectively adsorbed on the surface of the base 200b.

After selectively forming the first layer on the surface of the base 200b, the supply of the precursor gas and the catalyst gas into the process chamber 201 is stopped. Then, the gases remaining in the process chamber 201 are removed from the process chamber 201 under the same processing procedure and processing condition as those of the purging in Step A (purging). In this step, the processing temperature when performing the purging may be the same as the processing temperature when supplying the precursor gas and the catalyst gas.

A processing condition when supplying the precursor gas and the catalyst gas in Step B1 is exemplified as follows.

Processing temperature: room temperature to 200 degrees C., specifically room temperature to 120 degrees C.
Processing pressure: 133 to 1333 Pa
Precursor gas supply flow rate: 1 to 2000 sccm
Precursor gas supply time: 1 to 60 seconds
Catalyst gas supply flow rate: 1 to 2000 sccm
Inert gas supply flow rate (per gas supply pipe): 0 to 20000 sccm In this step, when the first layer is formed, the precursor gas may be adsorbed on a portion of the surface of the base 200a. However, an adsorption amount of the precursor gas is very small, and is much smaller than an adsorption amount of the precursor gas on the surface of the base 200b. Such selective (preferential) adsorption may be performed, because the processing condition in this step is set to be the low temperature condition described above and the condition in which the precursor gas is not decomposed in the vapor phase in the process chamber 201. Further, such selective (preferential) adsorption may be performed, because the film formation inhibition layer 310 is formed over the entire surface of the base 200a, whereas the film formation inhibition layer 310 is not formed in many regions of the surface of the base 200b.

As the precursor gas, for example, a gas containing Si and halogen may be used. Halogen includes chlorine (Cl), fluorine (F), bromine (Br), iodine (I), and the like. The Si- and halogen-containing gas may contain halogen in the form of a chemical bond between Si and halogen. The Si- and halogen-containing gas may further contain C. In such a case, the Si- and halogen-containing gas may contain C in the form of a Si—C bond. As the Si- and halogen-containing gas, for example, a silane-based gas containing Si, Cl, and an alkylene group and containing a Si—C bond, i.e., an alkylenechlorosilane-based gas may be used. In this regard, the alkylene group includes a methylene group, an ethylene group, a propylene group, a butylene group, and the like. Further, as the S- and halogen-containing gas, for example, a silane-based gas containing Si, Cl, and an alkyl group and containing a Si-bond, i.e., an alkylchlorosilane-based gas may be used. The alkylenechlorosilane-based gas and the alkylchlorosilane-based gas may contain Cl in the form of a Si—Cl bond and C in the form of a Si—C bond.

Examples of the Si- and halogen-containing gas may include an alkylenechlorosilane-based gas such as a bis (trichlorosilyl)methane ((SiCl$_3$)$_2$CH$_2$, abbreviation: BTCSM) gas, a 1,2-bis(trichlorosilyl)ethane ((SiCl$_3$)$_2$C$_2$H$_4$, abbreviation: BTCSE) gas, or the like, an alkylchlorosilane-based gas such as a 1,1,2,2-tetrachloro-1,2-dimethyldisilane ((CH$_3$)$_2$Si$_2$Cl$_4$, abbreviation: TCDMDS) gas, a 1,2-dichloro-1,1,2,2-tetramethyldisilane (CH$_3$)$_4$Si$_2$Cl$_2$, abbreviation: DCTMDS) gas, or the like, and a gas containing a cyclic structure composed of Si and C and containing halogen, such as a 1,1,3,3-tetrachloro-1,3-disilacyclobutane (C$_2$H$_4$Cl$_4$Si$_2$, abbreviation: TCDSCB) gas, or the like. Further, examples of the Si- and halogen-containing gas may also include an inorganic chlorosilane-based gas such as a tetrachlorosilane (SiCl$_4$, abbreviation: STC) gas, a hexachlorodisilane (Si$_2$Cl$_6$, abbreviation: HCDS) gas, an octachlorotrisilane (Si$_3$Cl$_8$, abbreviation: OCTS) gas, or the like.

Further, as the precursor gas, in place of the Si- and halogen-containing gas, an am inosilane-based gas such as a tetrakis(dimethylamino)silane (Si[N(CH$_3$)$_2$]$_4$, abbreviation: 4DMAS) gas, a tris(dimethylamino)silane (Si[N(CH$_3$)$_2$]$_3$H, abbreviation: 3DMAS) gas, a bis(diethylamino)silane (Si[N(C$_2$H$_5$)$_2$]$_2$H$_2$, abbreviation: BDEAS) gas, a bis(tert-butylamino)silane (SiH$_2$[NH(C$_4$H$_9$)]$_2$, abbreviation: BTBAS) gas, a (diisopropylamino)silane (SiH$_3$[N(C$_3$H$_7$)$_2$], abbreviation: DIPAS) gas, or the like may also be used. Further, the aminosilane-based gas may be used as one of the film formation inhibition gases in other embodiments to be described below. In this case, the precursor gas supply system described above is configured to be capable of supplying the film formation inhibition gas. Therefore, the precursor gas supply system also functions as a film formation inhibition gas supply system.

As the catalyst gas, for example, an amine-based gas containing C, N, and H may be used. Examples of the amine-based gas may include a cyclic amine-based gas such as a pyridine gas (C$_5$H$_5$N, abbreviation: py) gas, an aminopyridine (C$_5$H$_6$N$_2$) gas, a picoline (C$_6$H$_7$N) gas, a lutidine (C$_7$H$_9$N) gas, a piperazine (C$_4$H$_{10}$N$_2$) gas, a piperidine (C$_5$H$_{11}$N) gas, or the like, and a chain-like amine-based gas such as a triethylamine ((C$_2$H$_5$)$_3$N, abbreviation: TEA) gas, a diethylamine ((C$_2$H$_5$)$_2$NH, abbreviation: DEA) gas, or the like. Among them, the py gas may be used as the catalyst gas. The same applies to Step B2 to be described below.

[Step B2]

After the first layer is formed, a reaction gas such as an oxidizing agent and a catalyst gas are supplied to the wafer 200 in the process chamber 201, i.e., the first layer formed on the surface of the base 200b.

Specifically, the valves 243c and 243d are opened to supply the reaction gas into the gas supply pipe 232c and supply the catalyst gas into the gas supply pipe 232d. Flow rates of the reaction gas and the catalyst gas are regulated by the MFCs 241c and 241d, respectively. The reaction gas and the catalyst gas are supplied into the process chamber 201 via the nozzles 249c and 249a, then mixed in the process chamber 201, and exhausted via the exhaust port 231a. At this time, the reaction gas and the catalyst gas are supplied to the wafer 200 (supply of reaction gas+catalyst gas). At this time, the valves 243e to 243g may be opened to supply the inert gas into the process chamber 201 via the nozzles 249a to 249c, respectively.

At least a portion of the first layer formed on the surface of the base 200b in Step B1 may be oxidized by supplying the reaction gas such as an oxidizing agent and the catalyst gas to the wafer 200 under a processing condition to be described below. As a result, a second layer obtained by oxidizing the first layer is formed on the surface of the base 200b.

In this step, by supplying the catalyst gas together with the reaction gas, it is possible to cause the above oxidation reaction to proceed in a non-plasma atmosphere and under low temperature conditions to be described below. By forming the second layer in the non-plasma atmosphere and under the low temperature conditions to be described below, the molecules and atoms constituting the film formation inhibition layer 310 formed on the surface of the base 200a may be maintained without being extinguished (desorbed) from the surface of the base 200a.

After the first layer formed on the surface of the base 200b is oxidized and changed (converted) into the second layer, the supply of the reaction gas and catalyst gas into the process chamber 201 is stopped. Then, the gases remaining in the process chamber 201 is removed from the process chamber 201 by the same processing procedure and processing condition as those of the purging in Step A (purging). Further, the processing temperature when performing the purging in this step may be equal to the processing temperature when supplying the reaction gas and catalyst gas.

A processing condition when supplying the reaction gas and the catalyst gas in Step B2 is as follows.

Processing temperature: room temperature to 200 degrees C., specifically room temperature to 120 degrees C.,
Processing pressure: 133 to 1333 Pa,
Reaction gas supply flow rate: 1 to 2000 sccm,
Reaction gas supply time: 1 to 60 seconds,
Catalyst gas supply flow rate: 1 to 2000 sccm, and
Inert gas supply flow rate (per gas supply pipe): 0 to 20000 sccm.

As the reaction gas, an O- and H-containing gas may be used when forming an oxide film. As the O- and H-containing gas, for example, an O-containing gas containing an O—H bond such as a water vapor (H$_2$O gas), a hydrogen peroxide (H$_2$O$_2$) gas, or the like may be used. Further, as the O- and H-containing gas, an O—H bond-free O-containing gas such as hydrogen (H$_2$) gas+oxygen (O$_2$) gas, H$_2$ gas+ozone (O$_3$) gas, or the like may also be used. In the present disclosure, a parallel notation of two gases such as "H$_2$ gas+O$_2$ gas" means a mixed gas of the H$_2$ gas and the O$_2$ gas. When supplying a mixed gas, two gases may be mixed (premixed) in a supply pipe and then supplied into the process chamber 201, or two gases may be separately supplied into the process chamber 201 via different supply pipes and mixed (post-mixed) in the process chamber 201.

As the reaction gas, a N- and H-containing gas may be used when forming a nitride film. As the N- and H-containing gas, for example, a N- and H-containing gas containing a N—H bond, such as an ammonia (NH$_3$) gas, a hydrazine (N$_2$H$_4$) gas, a diazene (N$_2$H$_2$) gas, a N$_3$H$_8$ gas, or the like may be used. When forming a nitride film, the oxidizing agent, oxidation, and oxidation reaction described above may be replaced with a nitriding agent, nitriding, and nitriding reaction, respectively.

[Performing a Predetermined Number of Times]

Figure 5C:
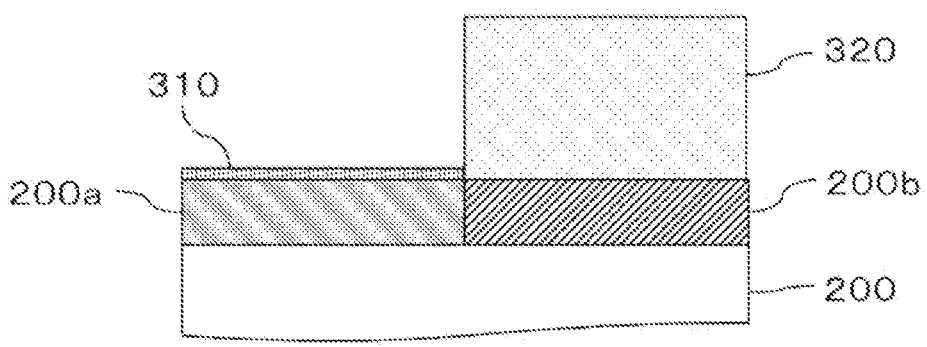

A cycle including non-simultaneously performing the above-described Steps B1 and B2, i.e., without synchronization is performed a predetermined number of times (n times, where n is an integer of 1 or more), whereby as shown in FIG. 5C, a film 320 may be selectively formed on the surface of the base 200b among the bases 200a and 200b exposed on the surface of the wafer 200. The above-described cycle may be performed multiple times. That is, a thickness of the second layer formed per cycle may be set to be smaller than a desired film thickness, and second layers may be stacked by performing the above-described cycle multiple times until the film thickness of the film 320 reaches the desired film thickness.

When performing Steps B1 and B2, the film formation inhibition layer 310 formed on the surface of the base 200a is maintained without being extinguished from the surface of the base 200a, as described above. Therefore, no film is formed on the surface of the base 200a. However, in a case where the formation of the film formation inhibition layer 310 on the surface of the base 200a becomes insufficient for some reasons, a very slight film may be formed on the surface of the base 200a. Even in this case, the thickness of the film formed on the surface of the base 200a is much smaller than the thickness of the film formed on the surface of the base 200b. In the present disclosure, the expression "a film is selectively formed on the surface of the base 200b" among the bases 200a and 200b includes a case where a very thin film is formed on the surface of the base 200a as described above, as well as a case where no film is formed on the surface of the base 200a.

[Step C (Post-Treatment)]

After completing Step B, Step C is performed. In Step C, a halogen-free substance that chemically reacts with the film formation inhibition layer 310 and the film 320 is supplied to the wafer 200 in the process chamber 201, i.e., the wafer 200 after the film 320 is formed on the surface of the base 200b, in a non-plasma atmosphere.

Further, in Step C, an output of the heater 207 is regulated such that the temperature of the wafer 200 is equal to or higher than the temperature of the wafer 200 in Step B, specifically higher than the temperature of the wafer 200 in Step B. Further, in step C, the output of the heater 207 may be regulated such that the temperature of the wafer 200 is equal to or higher than the temperature of the wafer 200 in Step A, specifically higher than the temperature of the wafer 200 in Step A.

Specifically, in this step, the valve 243h is opened to supply a portion or the entirety of the halogen-free substance into the gas supply pipe 232h. A flow rate of the halogen-free substance is regulated by the MFC 241h. The halogen-free substance is supplied into the process chamber 201 via the nozzle 249b, and is exhausted from the exhaust port 231a. In this operation, the halogen-free substance is supplied to the wafer 200 (halogen-free substance supply). At this time, the valves 243e to 243g may be opened to supply the inert gas into the process chamber 201 via the nozzles 249a to 249c, respectively.

Further, in this operation, the valve 243c may be opened to supply a portion or the entirety of the halogen-free substance into the gas supply pipe 232c. In this case, the flow rates of the halogen-free substances are regulated by the MFCs 241h and 241c, respectively. The halogen-free substances are supplied into the process chamber 201 via the nozzles 249b and 249c respectively, mixed after being supplied into the process chamber 201, and exhausted from the exhaust port 231a. In this operation, the halogen-free substance is supplied to the wafer 200 (halogen-free substance supply). At this time, the valves 243e to 243g may be opened to supply the inert gas into the process chamber 201 via the nozzles 249a to 249c, respectively.

Figure 5D:
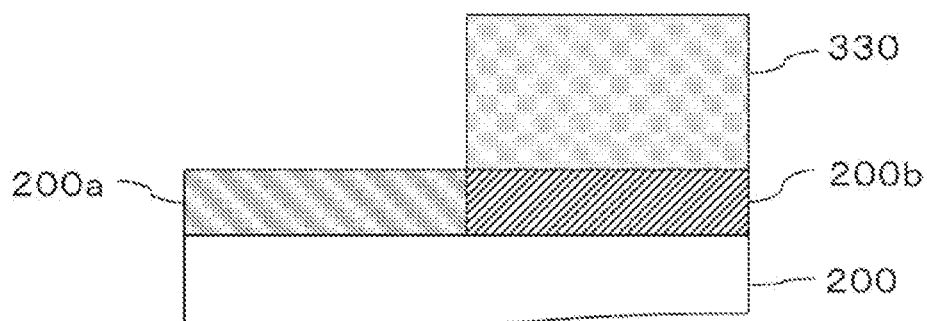

By supplying the halogen-free substance to the wafer 200 under a processing condition to be described below, as shown in FIG. 5D, molecules and atoms constituting the film formation inhibition layer 310 formed on the surface of the base 200a may be desorbed and removed from the surface of the base 200a by a chemical reaction with the halogen-free substance, or a function of the film formation inhibition layer 310 as an inhibitor may be nullified. Nullifying the function of the film formation inhibition layer 310 as the inhibitor is also simply referred to as nullifying the film formation inhibition layer 310. In some cases, a portion of the film formation inhibition layer 310 may be removed and another portion thereof may be nullified. In other words, the film formation inhibition layer 310 may be removed and nullified at the same time. That is, in this step, at least one selected from the group of removal and nullification of the film formation inhibition layer 310 is performed. As a result, it is possible to reset a surface state of the base 200a and perform the film-forming process on the surface of the base 200a in the subsequent steps.

Further, nullifying the function of the film formation inhibition layer 310 as the inhibitor means that a molecular structure of the film formation inhibition layer 310 formed on the surface of the base 200a and an arrangement structure of atoms on the surface of the film formation inhibition layer 310, and the like are chemically changed to enable the adsorption of the film-forming gases (the precursor gas, the reaction gas, etc.) on the surface of the base 200a and the reaction between the surface of the base 200a and the film-forming gas (the precursor gas, the reaction gas, etc.).

Further, in this step, by the chemical reaction between the film 320 formed on the surface of the base 200b and the halogen-free substance, it is possible to remove impurities such as Cl, H, hydrocarbon compounds and moisture in the film 320, align the arrangement of the atoms constituting the film 320, shorten a bond distance between atoms, and strengthen bonds of the atoms. That is, in this step, it is possible to remove impurities in the film 320, densify the film 320, and improve a film quality. As described above, in this step, as shown in FIG. 5D, the film 320 formed on the surface of the base 200b in Step B may be changed to a film 330 that is more improved in a film quality than the film 320, i.e., the film 330 that is higher in film quality than the film 320.

As described above, in this step, by the action of the halogen-free substance, the process of at least one selected from the group of removal and nullification of the film formation inhibition layer 310 formed on the surface of the base 200a, and the process of modifying the film 320 formed on the surface of the base 200b are performed simultaneously in parallel. In other words, in this step, by the action of the halogen-free substance, a treatment for the film formation inhibition layer 310 formed on the surface of the base 200a and a treatment for the film 320 formed on the surface of the base 200b may be performed simultaneously and in parallel. Thus, the post-treatment in this step is also referred to as a parallel post-treatment.

After performing the process of at least one selected from the group of removal and nullification of the film formation inhibition layer 310 formed on the surface of the base 200a, and the process of modifying the film 320 formed on the surface of the base 200b, the supply of the halogen-free substance into the process chamber 201 is stopped. Then, the gases and the like remaining in the process chamber 201 are removed from the process chamber 201 by the same processing procedure and processing condition as those of the purging in Step A (purging). Further, the processing temperature when performing the purging in this step may be set to be equal to the processing temperature when supplying the halogen-free substance.

This step may be performed under the processing condition in which the process of at least one selected from the group of removal and nullification of the film formation inhibition layer 310 formed on the surface of the base 200a, and the process of modifying the film 320 formed on the surface of the base 200b may be performed.

A processing condition when supplying the halogen-free substance in Step C is exemplified as follows.

Processing temperature: 200 to 1000 degrees C., specifically 400 to 700 degrees C., Processing pressure: 1 to 120000 Pa, specifically 1 to 13300 Pa, Halogen-free substance supply flow rate: 1 to 30000 sccm, specifically 1 to 20000 sccm Halogen-free substance supply time: 1 to 18000 seconds, specifically 120 to 10800 seconds, and Inert gas supply flow rate (per gas supply pipe): 0 to 20000 sccm.

As the halogen-free substance, for example, an oxidizing gas (oxidizing agent) may be used. By using the oxidizing gas as the halogen-free substance, the process of at least one selected from the group of removal and nullification of the film formation inhibition layer 310 formed on the surface of the base 200a, and the process of modifying the film 320 formed on the surface of the base 200b may be performed efficiently and simultaneously in parallel.

The oxidizing gas, which is an example of the halogen-free substance, may contain, for example, one or more selected from the group of an O- and H-containing gas, an O-containing gas, and O-containing gas+H-containing gas. In this regard, as the O- and H-containing gas, for example, a $H_2O$ gas, a $H_2O_2$ gas, or the like may be used. As the O-containing gas, for example, an $O_2$ gas, an $O_3$ gas, or the like may be used. As the H-containing gas, a $H_2$ gas, a $NH_3$ gas, or the like may be used.

Specifically, the oxidizing gas, which is an example of the halogen-free substance, may include, for example, one or more selected from the group of a $H_2O$ gas, a $H_2O_2$ gas, an $O_2$ gas, an $O_3$ gas, $O_2$ gas+$H_2$ gas, $O_3$ gas+$H_2$ gas, $O_2$ gas+$NH_3$ gas, and $O_3$ gas+$NH_3$ gas.

Further, as the halogen-free substance, for example, a nitriding gas (nitriding agent) may be used. By using the nitriding gas as the halogen-free substance, the process of at least one selected from the group of removal and nullification of the film formation inhibition layer 310 formed on the surface of the base 200a, and the process of modifying the film 320 formed on the surface of the base 200b may be performed efficiently and simultaneously in parallel.

The nitriding gas, which is an example of the halogen-free substance, may include, for example, a N- and H-containing gas. Specifically, the nitriding gas, which is an example of the halogen-free substance, may include one or more selected from the group of a $NH_3$ gas, a $N_2H_4$ gas, a $N_2H_2$ gas, and a $N_3H_8$ gas.

In this step, when the film 320 is, for example, a silicon oxide film (SiO film), an oxidizing gas such as an O-containing gas or O-containing gas+H-containing gas may be used as the halogen-free substance to efficiently remove the impurities contained in the film 320 without substantially changing the composition ratio of the film 320 formed on the surface of the base 200b. In this case, it is possible to substantially maintain the composition ratio of the film 320 (SiO film) formed on the surface of the base 200b even after performing this step.

For the same reason, when the film 320 is, for example, a silicon oxycarbide film (SiOC film), for example, an oxidizing gas such as an O-containing gas or O-containing gas+H-containing gas may be used as the halogen-free substance. In this case, it is possible to substantially maintain the composition ratio of the film 320 (SiOC film) formed on the surface of the base 200b even after performing this step. However, in this case, the oxidizing gas as the halogen-free substance may be supplied to the wafer 200 under a processing condition where it is possible to hold the Si—C bonds contained in the film 320 (SiOC film) without breaking the Si—C bonds (processing condition where an oxidizing power is weakened) to prevent C from being desorbed from the film 320 (SiOC film). Such a processing condition may be realized, for example, by setting at least one selected from the group of a processing temperature, a processing pressure, and an oxidizing gas supply flow rate to be lower than that when supplying the oxidizing gas as the halogen-free substance to the film 320 (SiO film) as described above, or by shortening a oxidizing gas supply time.

For the same reason, when the film 320 is, for example, a silicon nitride film (SiN film), for example, a nitriding gas such as a N- and H-containing gas may be used as the halogen-free substance. In this case, it is possible to substantially maintain the composition ratio of the film 320 (SiN film) formed on the surface of the base 200b even after performing this step.

For the same reason, when the film 320 is, for example, a silicon carbonitride film (SiCN film), for example, a nitriding gas such as a N-and H-containing gas may be used as the halogen-free substance. In this case, it is possible to substantially maintain the composition ratio of the film 320 (SiCN film) formed on the surface of the base 200b even after performing this step. However, in this case, the nitriding gas as the halogen-free substance may be supplied to the wafer 200 under a processing condition where it is possible to hold the Si—C bonds contained in the film 320 (SiCN film) without breaking the Si—C bonds (processing condition where a nitriding power is weakened) to prevent C from being desorbed from the film 320 (SiCN film). Such a processing condition may be realized, for example, by setting at least one selected from the group of a processing temperature, a processing pressure, and a nitriding gas supply flow rate to be lower than that when supplying the nitriding gas as the halogen-free substance to the film 320 (SiN film), as described above, or by shortening a nitriding gas supply time.

(After-Purge and Returning to Atmospheric Pressure)

After the parallel post-treatment is completed, an inert gas is supplied into the process chamber 201 from each of the nozzles 249a to 249c and exhausted from the exhaust port 231a. The inert gas supplied from the nozzles 249a to 249c acts as a purge gas. As a result, the inside of the process chamber 201 is purged, such that gases, reaction by-products, and the like remaining in the process chamber 201 are removed from the inside of the process chamber 201 (after-purge). Thereafter, the atmosphere in the process chamber 201 is replaced with the inert gas (inert gas replacement), and the pressure in the process chamber 201 is returned to the atmospheric pressure (returning to atmospheric pressure).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219s is moved and the lower end opening of the manifold 209 is sealed by the shutter 219s via the O-ring 220c (shutter closing). The processed wafers 200 are discharged out of the boat 217 after being unloaded to the outside of the reaction tube 203 (wafer discharging).

(3) Effects of the Embodiments of the Present Disclosure

According to the embodiments of the present disclosure, one or more selected from the group of the following effects may be obtained.

(a) After selective growth, in the post-treatment, the halogen-free substance is supplied to the wafer 200, whereby the process of modifying the film 320 formed on the surface of the base 200b may be performed while performing the process of at least one selected from the group of removal and nullification of the film formation inhibition layer 310 formed on the surface of the base 200a. Thus, it possible to form a film on the surface of the base 200a in the subsequent step. Further, it is possible to improve a film quality by removing impurities from the film 320 formed on the surface of the base 200b and densifying the film 320. Further, since the treatment for the film formation inhibition layer 310 formed on the surface of the base 200a and the treatment for the film 320 formed on the surface of the base 200b may be performed simultaneously and in parallel, that is, since two different treatment processes may be performed at the same time, it is possible to improve a productivity of substrate processing.

(b) By setting the temperature of the wafer 200 in the post-treatment after the selective growth to be equal to or higher than the temperature of the wafer 200 in the selective growth, it is possible to enhance an efficiency of the process of at least one selected from the group of removal and nullification of the film formation inhibition layer 310 formed on the surface of the base 200a and an efficiency of the process of modifying the film 320 formed on the surface of the base 200b. This makes it possible to further improve the productivity of substrate processing.

(c) After the selective growth, in the post-treatment, the halogen-free substance is supplied to the wafer 200 in a non-plasma atmosphere, whereby the process of at least one selected from the group of removal and nullification of the film formation inhibition layer 310 formed on the surface of the base 200a and the process of modifying the film 320 formed on the surface of the base 200b may be performed simultaneously and in parallel, while avoiding plasma damage to the wafer 200, the bases 200a and 200b on the surface of the wafer 200, the film 320 formed on the surface of the base 200b, and the like.

(d) By performing the film formation inhibition layer formation, the selective growth, and the post-treatment respectively in a non-plasma atmosphere, it is possible to avoid plasma damage to the wafer 200, the bases 200a and 200b on the surface of the wafer 200, the film formation inhibition layer 310 formed on the surface of the base 200a, the film 320 or 330 formed on the surface of the base 200b, and the like. This makes it possible to apply the method of the present disclosure to a process in which plasma damage is a concern.

(e) After the selective growth, in the post-treatment, the halogen-free substance is supplied to the wafer 200, whereby the process of at least one selected from the group of removal and nullification of the film formation inhibition layer 310 formed on the surface of the base 200a and the process of modifying the film 320 formed on the surface of the base 200b may be performed simultaneously and in parallel, while avoiding halogen damage, halogen contamination, halogen residue, and the like for the wafer 200, the bases 200a and 200b on the surface of the wafer 200, the film 320 formed on the surface of the base 200b, and the like.

(4) Modifications

Step C in embodiments of the present disclosure may be modified as in the modifications shown below. Unless otherwise specified, a processing procedures and a processing condition in each step of each modification may be the same as the processing procedure and the processing condition in each step of the substrate processing sequence described above. Further, the modifications shown below are different in Step C from the above-described substrate processing sequence, and Step A and B in the modifications are the same as those in the above-described substrate processing sequence. Therefore, description of Step A and Step B is omitted in the description of the modifications shown below.

(First Modification)

In Step C, the composition ratio of the film 320 may be changed by modifying the film 320 formed on the surface of the base 200b.

That is, in Step C, by the action of the halogen-free substance, the process of at least one selected from the group of removal and nullification of the film formation inhibition layer 310 formed on the surface of the base 200a and the modifying process of changing the composition ratio of the film 320 formed on the surface of the base 200b may be performed simultaneously and in parallel.

Figure 6A:
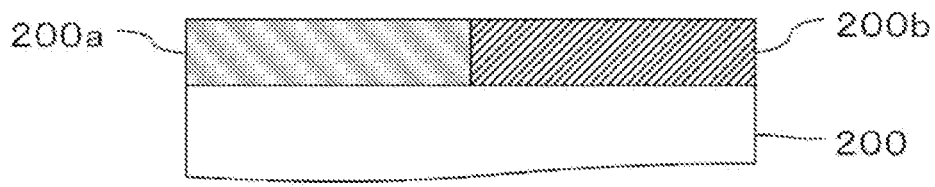
FIGS. 6A to 6D are partially enlarged cross-sectional views of a surface of a wafer at the respective steps of selective growth according to a first modification of the present disclosure.
Figure 6B:
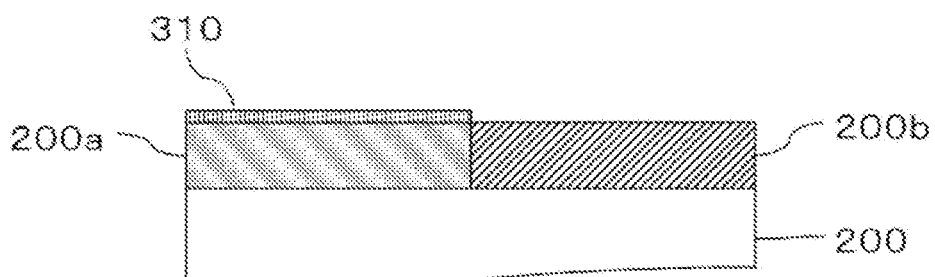
Figure 6C:
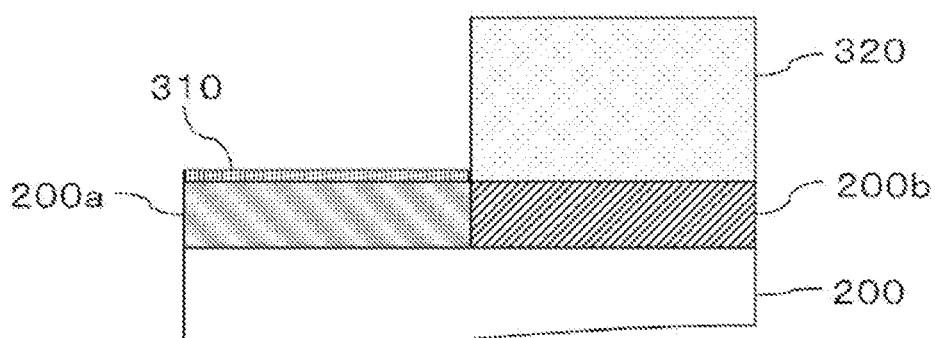
Figure 6D:
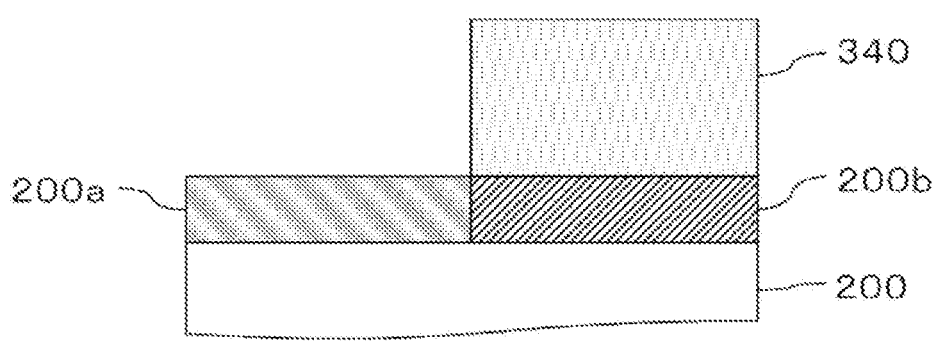

FIG. 6D shows a surface state of the wafer 200 after, as an example, in Step C, the film formation inhibition layer 310 formed on the surface of the base 200a is removed from the surface of the base 200a by supplying the halogen-free substance to the wafer 200, and the composition ratio of the film 320 formed on the surface of the base 200b is changed to change the film 320 into the film 340 that is different in the composition ratio from the film 320.

Specifically, in this modification, for example, when the film 320 is a SiOC film, in Step C, an oxidizing gas such as an O-containing gas is used as the halogen-free substance such that a ratio of C concentration to O concentration (C/O ratio) in the film 340 (SiOC film) may be made lower than a C/O ratio in the film 320 (SiOC film) before Step C is performed. Similarly, when the film 320 is a SiOC film, in Step C, an oxidizing gas such as O-containing gas+H-containing gas is used as the halogen-free substance such that C/O ratio in the film 340 (SiOC film) may be made even lower than a C/O ratio in the film 340 (SiOC film) after the modifying process is performed by using the oxidizing gas such as an O-containing gas as the halogen-free substance in Step C.

Specifically, for example, when the film 320 is a SiCN film, in Step C, for example, a nitriding gas such as a N- and H-containing gas is used as halogen-free substance such that the ratio of the C concentration to the N concentration (C/N ratio) in the film 340 (SiCN film) may be made lower than the C/N ratio in the film 320 (SiCN film) before Step C is performed.

Specifically, for example, when the film 320 is a silicon oxynitride film (SiON film), in Step C, for example, a nitriding gas such as a N- and H-containing gas is used as the halogen-free substance such that a ratio of the N concentration to the O concentration (N/O ratio) in the film 340 (SiON film) made be made higher than a N/O ratio in the film 320 (SiON film) before Step C is performed. Similarly, when the film 320 is a SiON film, in Step C, an oxidizing gas such as an O-containing gas is used as the halogen-free substance such that the N/O ratio in the film 340 (SiON film) made be made lower than the N/O ratio in the film 320 (SiON film) before Step C is performed.

In this modification as well, the same effects as in the above-described embodiments may be obtained. Further, according to this modification, it becomes possible to control the composition ratio of the film 320 formed on the surface of the base 200*b*, while performing the process of at least one selected from the group of removal and nullification of the film formation inhibition layer 310 formed on the surface of the base 200*a*. As a result, it is possible to obtain the film 340 whose composition ration is controlled to be a desired composition ratio, and to enhance a productivity of substrate processing.

(Second Modification)

In Step C, by modifying the film 320 formed on the surface of the base 200*b*, an element (hereinafter also referred to as an additional element) not contained in the film 320 and contained in the halogen-free substance may be added (doped) into the film 320. That is, in Step C, the film 320 formed in Step B may be doped with the additional element. The process of doping the film 320 with the additional element in this way is also referred to as additional element addition, additional element doping, or additional element dope.

That is, in Step C, by the action of the halogen-free substance, the process of at least one selected from the group of removal and nullification of the film formation inhibition layer 310 formed on the surface of the base 200*a*, and the modifying process of doping the film 320 formed on the surface of the base 200*b* with the additional element may be performed simultaneously and in parallel.

Figure 7A:
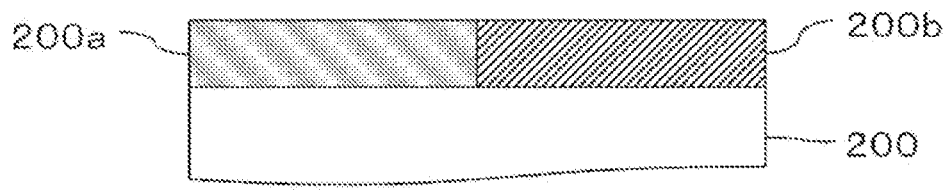
FIGS. 7A to 7D are partially enlarged cross-sectional views of a surface of a wafer at the respective steps of selective growth according to a second modification of the present disclosure.
Figure 7B:
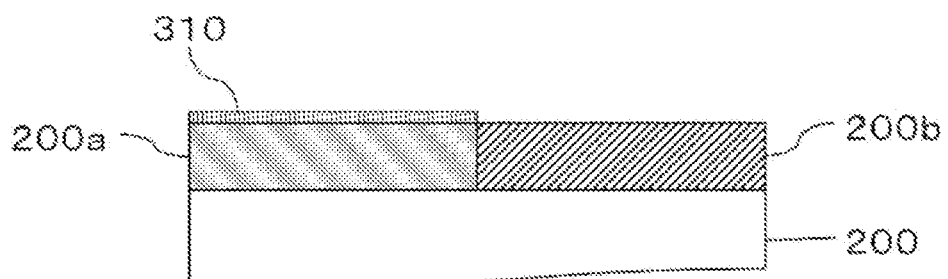
Figure 7C:
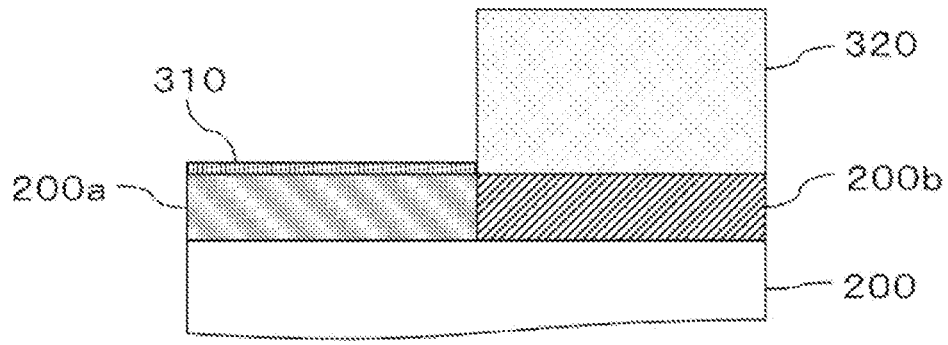
Figure 7D:
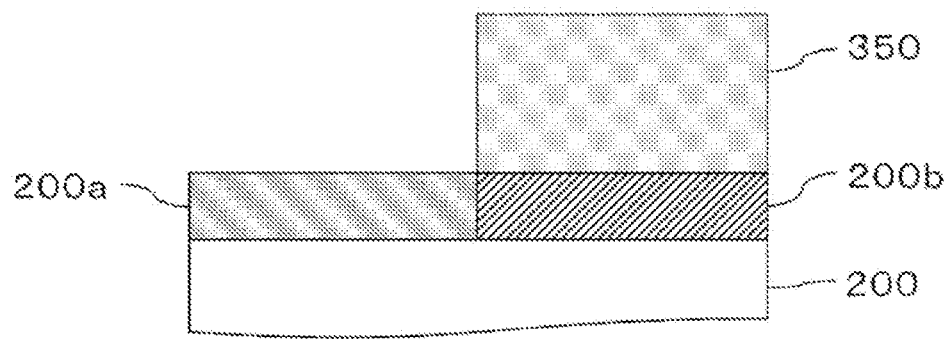

FIG. 7D shows a surface state of the wafer 200 after, as an example, in Step C, the film formation inhibition layer 310 formed on the surface of the base 200*a* is removed from the surface of the base 200*a* by supplying the halogen-free substance to the wafer 200, and the film 320 is changed into the film 350 obtained by adding an additional element not contained in the film 320 formed on the surface of the base 200*b* to the film 320 by adding (doping) the additional element to the film 320.

Specifically, in this modification, for example, when the film 320 is a SiOC film, in Step C, for example, a nitriding gas such as a N- and H-containing gas is used as the halogen-free substance such that N may be added (doped) to the film 320 (SiOC film) to change the film 320 (SiOC film) into a film 350 (SiOC film doped with N).

Specifically, for example, when the film 320 is a SiO film, in Step C, a nitriding gas such as a N- and H-containing gas is used as the halogen-free substance such that N may be added (doped) to the film 320 (SiO film) to change the film 320 (SiO film) into a film 350 (SiO film doped with N).

Specifically, for example, when the film 320 is a SiCN film, in Step C, an oxidizing gas such as an O-containing gas is used as the halogen-free substance such that O may be added (doped) to the film 320 (SiCN film) to change the film 320 (SiCN film) into a film 350 (SiCN film doped with O).

In this modification as well, the same effects as in the above-described embodiments may be obtained. Further, according to this modification, it becomes possible to add the additional element into the film 320 formed on the surface of the base 200*b*, while performing the process of at least one selected from the group of removal and nullification of the film formation inhibition layer 310 formed on the surface of the base 200*a*. As a result, it is possible to obtain the film 350 doped with a desired additional element, and to enhance the productivity of substrate processing.

(Third Modification)

In Step C, by modifying the film 320 formed on the surface of the base 200*b*, the film 320 may be changed into a film that is different in chemical structure (e.g., chemical component, chemical composition, molecular structure, etc.) from the film 320.

That is, in Step C, by the action of the halogen-free substance, the process of at least one selected from the group of removal and nullification of the film formation inhibition layer 310 formed on the surface of the base 200*a*, and the modifying process of changing the film 320 formed on the surface of the base 200*b* into the film that is different in the chemical structure from the film 320 may be performed simultaneously and in parallel.

Figure 8A:
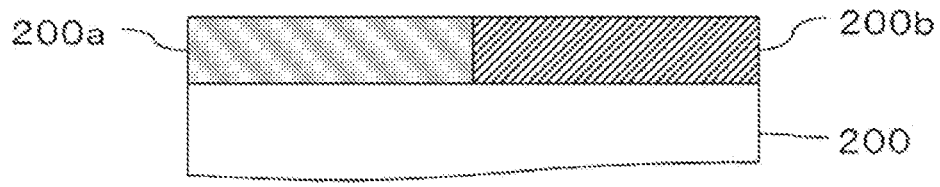
FIGS. 8A to 8D are partially enlarged cross-sectional views of a surface of a wafer at the respective steps of selective growth according to a third modification of the present disclosure.
Figure 8B:
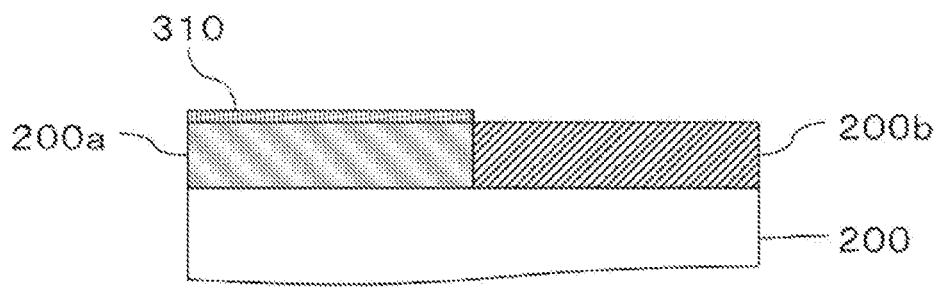
Figure 8C:
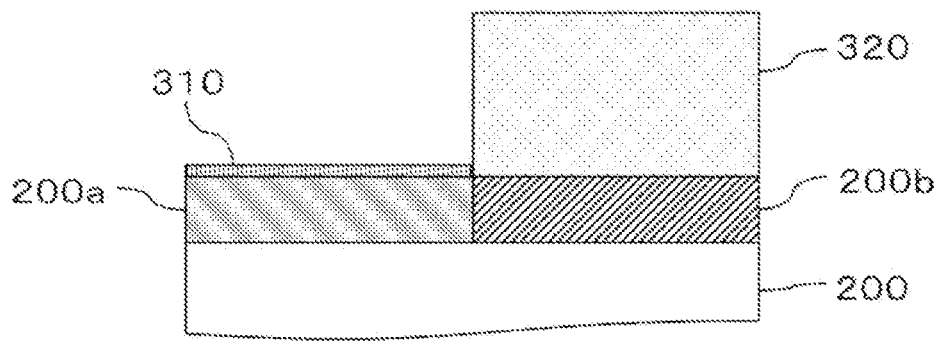
Figure 8D:
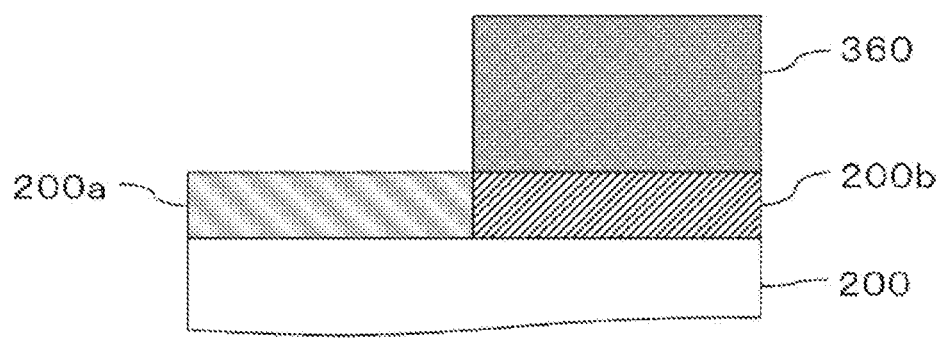

FIG. 8D shows a surface state of the wafer 200 after, as an example, in Step C, the film formation inhibition layer 310 formed on the surface of the base 200*a* is removed from the surface of the base 200*a* by supplying the halogen-free substance to the wafer 200, and the film 320 formed on the surface of the base 200*b* is changed into a film 360 that is different in chemical structure from the film 320.

Specifically, in this modification, for example, when the film 320 is a SiOC film, in Step C, for example, a nitriding gas such as a N- and H-containing gas may be used as the halogen-free substance such that the film 320 (SiOC film) may be changed into the film 360 (SiOCN film).

Further, specifically, for example, when the film 320 is a SiO film, in Step C, for example, a nitriding gas such as a N- and H-containing gas may be used as the halogen-free substance such that the film 320 (SiO film) may be changed into the film 360 (SiON film).

Further, specifically, for example, when the film 320 is a SiN film, in Step C, for example, an oxidizing gas such as an O-containing gas may be used as the halogen-free substance such that the film 320 (SiN film) may be changed into the film 360 (SiON film).

Further, specifically, for example, when the film 320 is a SiN film, in Step C, for example, an oxidizing gas such as an O-containing gas or O-containing gas+H-containing gas may be used as the halogen-free substance such that the film 320 (SiN film) may be changed into the film 360 (SiO film). When the film 320 (SiN film) is changed to the film 360 (SiO film), the oxidizing gas may be supplied to the wafer 200 under a processing condition where, in Step C, an oxidizing power becomes stronger than that when the film 320 (SiN film) is changed to the film 360 (SiON film).

Further, specifically, for example, when the film 320 is a SiCN film, in Step C, for example, an oxidizing gas such as an O-containing gas is used as the halogen-free substance such that the film 320 (SiCN film) may be changed to the film 360 (SiOCN film).

In this modification as well, the same effects as in the above-described embodiments may be obtained. Further, according to this modification, it becomes possible to change the chemical structure of the film 320 formed on the surface of the base 200*b*, while performing the process of at least one selected from the group of removal and nullification of the film formation inhibition layer 310 formed on the surface of the base 200*a*. As a result, it is possible to obtain the film 360 with a desired chemical structure, and to enhance the productivity of substrate processing.

(Fourth Modification)

In Step C, by modifying the film 320 formed on the surface of the base 200*b*, a portion of the surface (e.g., surface layer) of the film 320 may be changed into material that is different in chemical structure (e.g., chemical component, chemical composition, molecular structure, etc.) from the film 320.

That is, in Step C, by the action of the halogen-free substance, the process of at least one selected from the group of removal and nullification of the film formation inhibition layer 310 formed on the surface of the base 200a, and the modifying process of changing a portion of the surface of the film 320 formed on the surface of the base 200b into the material that is different in the chemical structure from the film 320 may be performed simultaneously and in parallel.

Figure 9A:
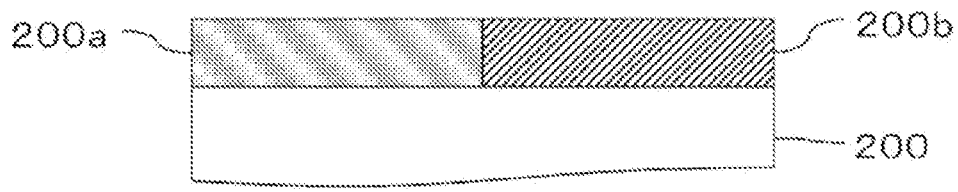
FIGS. 9A to 9D are partially enlarged cross-sectional views of a surface of a wafer at the respective steps of selective growth according to a fourth modification of the present disclosure.
Figure 9B:
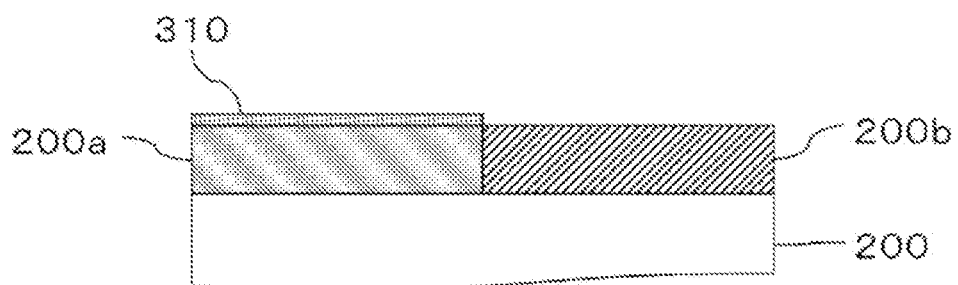
Figure 9C:
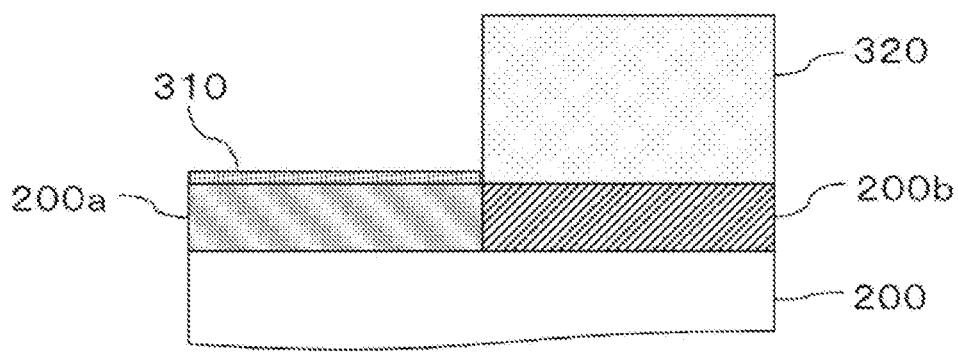
Figure 9D:
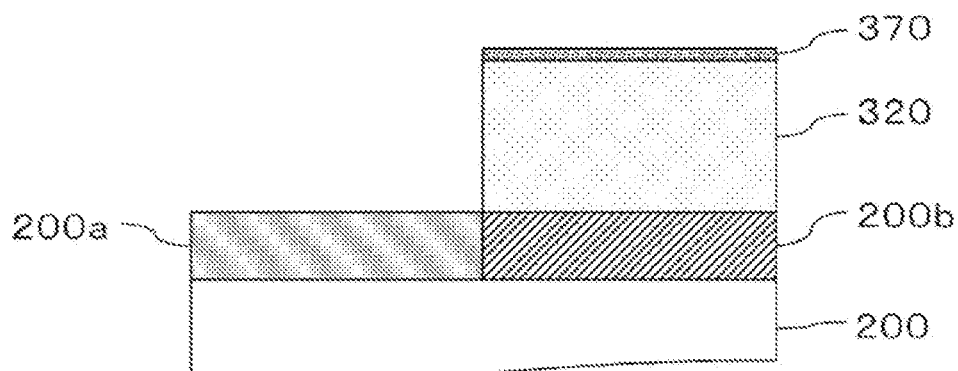

FIG. 9D shows a surface state of the wafer 200 after, as an example, in Step C, the film formation inhibition layer 310 formed on the surface of the base 200a is removed from the surface of the base 200a by supplying the halogen-free substance to the wafer 200, and the surface layer, which is a portion of the film 320 formed on the surface of the base 200b, is changed into a film 370 that is different in chemical structure from the film 320.

Specifically, in this modification, for example, when the film 320 is a SiOC film, in Step C, for example, a nitriding gas such as a N- and H-containing gas may be used as the halogen-free substance such that a portion of the surface of the film 320 (SiOC film) may be changed to the film 370 (SiOCN film). Further, in this case, a portion of the surface of the film 320 (SiOC film) becomes the film 370 (SiOCN film), but the rest of the surface of the film 320 (SiOC film) is maintained as the film 320 (SiOC film). That is, in this case, a stacked film is formed by stacking the film 370 (SiOCN film) on the film 320 (SiOC film).

Further, specifically, for example, when the film 320 is a SiO film, in Step C, for example, a nitriding gas such as a N- and H-containing gas is used as the halogen-free substance such that a portion of the surface of the film 320 (SiO film) may be changed to the film 370 (SiON film). Further, in this case, a portion of the surface of the film 320 (SiO film) becomes the film 370 (SiON film), but the rest of the surface of the film 320 (SiO film) is maintained as the film 320 (SiO film). That is, in this case, a stacked film is formed by stacking the film 370 (SiON film) on the film 320 (SiO film).

Further, specifically, for example, when the film 320 is a SiN film, in Step C, for example, an oxidizing gas such as an O-containing gas is used as the halogen-free substance such that a portion of the surface of the film 320 (SiN film) may be changed to the film 370 (SiON film or SiO film). Further, in this case, a portion of the surface of the film 320 (SiN film) becomes the film 370 (SiON film or SiO film), but the rest of the surface is maintained as the film 320 (SiN film). That is, in this case, a stacked film is formed by stacking the film 370 (SiON film or SiO film) on the film 320 (SiN film).

In this modification as well, the same effects as in the above-described embodiments may be obtained. Further, according to this modification, it becomes possible to change the chemical structure of a portion of the surface of the film 320 formed on the surface of the base 200b, while performing the process of at least one selected from the group of removal and nullification of the film formation inhibition layer 310 formed on the surface of the base 200a. As a result, it is possible to obtain the film 320 including the film 370 with a desired chemical structure as a surface layer, i.e., a stacked film in which the film 370 is stacked on the film 320, and to enhance the productivity of substrate processing.

Other Embodiments of the Present Disclosure

The embodiments of the present disclosure are specifically described above. However, the present disclosure is not limited to the embodiments described above, and may be modified in various ways without departing from the scope of the present disclosure.

For example, as the film formation inhibition gas used in Step A, a F-containing gas may also be used. By using the F-containing gas, it is possible to F-terminate the surface of the base 200a and form the film formation inhibition layer 310 containing F-terminations on the surface of the base 200a. The film formation inhibition layer 310 containing F terminations is also referred to as F termination layer. In the embodiments, the F-containing gas may be supplied from the film formation inhibition gas supply system of the above-described embodiments.

, A Si-containing gas such as an aminosilane-based gas may be supplied to the wafer 200, before supplying the F-containing gas to the wafer 200 including the base 200a and the base 200b exposed on the surface thereof, to efficiently form the film formation inhibition layer 310 containing the F terminations on the surface of the base 200a. In this case, after the aminosilane-based gas is supplied to the wafer 200, the inside of the process chamber 201 may be purged by the same processing procedure and processing condition as the purging in Step A, and then the F-containing gas may be supplied to the wafer 200. In this case, the F-containing gas and the aminosilane-based gas may be supplied from the film formation inhibition gas supply system and the precursor gas supply system of the above-described embodiments. Hereinafter, the aminosilane-based gas and the F-containing gas are also referred to as a first film formation inhibition gas and a second film formation inhibition gas, respectively.

After forming the film formation inhibition layer 310 containing the F terminations on the surface of the base 200a in Step A, the selective growth, and the parallel post-treatment similar to those of the above-described embodiments may be performed by performing the processes in Step B and Step C of the embodiments in this order. The processing sequence of the embodiments of the present disclosure may be indicated as follows.

First film formation inhibition gas→second film formation inhibition gas→(precursor gas+catalyst gas→reaction gas+catalyst gas)×n→halogen-free substance Further, in the embodiments of the present disclosure, since the halogen-free substance is supplied to the wafer 200 in Step C after the selective growth, the process of modifying the film 320 formed on the surface of the base 200b may be performed while performing the process of at least one selected from the group of removal and nullification of the film formation inhibition layer 310 formed on the surface of the base 200a. As a result, it is possible to obtain the film 330 that is more improved in a film quality than the film 320, and to improve the productivity of substrate processing.

As the first film formation inhibition gas, i.e., the Si-containing gas such as an aminosilane-based gas, it is possible to use one or more aminosilane compounds selected from the group of the aminosilane compounds represented by the above-described formula [1], for example, a mono-aminosilane ($SiH_3(NR_2)$, abbreviation: MAS) gas in which A is a H atom and x is 3 in formula [1] (i.e., a compound containing one amino group in one molecule), a bisaminosilane ($SiH_2(NR_2)_2$, abbreviation: BAS) gas in which A is a H atom and x is 2 in formula [1] (i.e., a compound containing two amino groups in one molecule), and a trisaminosilane ($SiH(NR_2)_3$, abbreviation: TAS) gas in which A is a H atom and x is 1 in formula [1] (i.e., a compound containing three amino groups in one molecule). Among the above-described gases, the MAS gas may be used as the am inosilane-based gas. By using the MAS gas as the first film formation inhibition gas, in Step A, the surface of the base 200a may be more uniformly and sufficiently F-terminated.

Examples of the MAS gas may include an (ethylmethylamino)silane ($SiH_3[N(CH_3)(C_2H_5)]$) gas, a (dimethylamino)silane ($SiH_3[N(CH_3)_2]$) gas, a (diisopropylamino)silane ($SiH_3[N(C_3H_7)_2]$) gas, a (di-secondary-butylamino)silane ($SiH_3[H(C_4H_9)_2]$) gas, a (dimethylpiperidino)silane ($SiH_3[NC_5H_8(CH_3)_2]$) gas, a (diethylpiperidino)silane ($SiH_3[NC_5H_8(C_2H_5)_2]$) gas, and the like.

Examples of the second film formation inhibition gas, i.e., the F-containing gas, may include a fluorine ($F_2$) gas, a chlorine trifluoride ($ClF_3$) gas, a chlorine fluoride gas (ClF) gas, a nitrogen trifluoride ($NF_3$) gas, $ClF_3$ gas+nitrogen oxide (NO) gas, ClF gas+NO gas, $F_2$ gas+NO gas, $NF_3$ gas+NO gas, a tungsten hexafluoride ($WF_6$) gas, and a nitrosyl fluoride (FNO) gas.

Further, for example, in Step A, the supply of the film formation inhibition gas to the wafer 200 and the purging may be alternately performed multiple times. That is, the film formation inhibition gas may be supplied to the wafer 200 intermittently with purging interposed therebetween. The purging in this case may be performed according to the same processing procedure and processing condition as the purging in Step A. In this case, the film formation inhibition layer 310 may be formed on the surface of the base 200a while removing the superfluous physically-adsorbed components of the film formation inhibition gas adsorbed on the surface of the wafer 200, the film formation inhibition gas not adsorbed on the surface of the wafer 200, and the like by the purging. Further, in this case, it is possible to form the film formation inhibition layer 310 with a high density of hydrocarbon group terminations or F terminations on the surface of the base 200a. As a result, the selectivity of the selective growth in Step B may be further enhanced. Further, it is possible to reduce an amount of the film formation inhibition gas used.

Further, for example, in Step A, the film formation inhibition gas may be supplied to the wafer 200 in a state where the exhaust system is closed, i.e., a state where the APC valve 244 is fully closed. That is, in Step A, the film formation inhibition gas may be confined within the process chamber 201. In this case, the film formation inhibition gas may be distributed throughout the inside of the process chamber 201 and over the entire surface of the wafer 200, and the surface of the base 200a of the wafer 200 may be uniformly terminated with hydrocarbon groups or F. As a result, selectivity of the selective growth in Step B may be further enhanced. Further, it is also possible to greatly reduce the amount of the film formation inhibition gas used.

In Step A, the process of confining the film formation inhibition gas within the process chamber 201 and the purging may be alternately performed multiple times. That is, the film formation inhibition gas may be intermittently confined within the process chamber 201 with the purging interposed therebetween. The purging in this case may be performed according to the same processing procedure and processing condition as the purging in Step A. In this case, the film formation inhibition layer 310 may be formed on the surface of the base 200a while removing superfluous physically-adsorbed components of the film formation inhibition gas adsorbed on the surface of the wafer 200, the film formation inhibition gas not adsorbed on the surface of the wafer 200, and the like by the purging. Further, in this case, it is possible to form the film formation inhibition layer 310 with a high density of hydrocarbon group terminations or F terminations on the surface of the base 200a. As a result, the selectivity of the selective growth in Step B may be further enhanced.

Further, for example, in the selective growth, depending on a type of gases such as the precursor gas and the reaction gas and a processing condition such as a processing temperature, as in the processing sequences shown below, the supply of the catalyst gas may be omitted in at least one selected from the group of Steps B1 and B2. Further, it is possible to omit the supply of the catalyst gas in both Steps B1 and B2. For the sake of convenience, processing sequences shown below indicate Steps B1 and B2, and also indicate the processing sequences including Steps B1 and B2 in the above-described embodiments of the present disclosure.

(Precursor gas+catalyst gas→reaction gas+catalyst gas)×n (Precursor gas+catalyst gas→reaction gas)×n (Precursor gas→reaction gas+catalyst gas)×n (Precursor gas→reaction gas)×n In these cases, the processing temperature in Steps B1 and B2 may be set to be higher than the processing temperature in Steps B1 and B2 of the above-described embodiments of the present disclosure. For example, the processing temperature in Steps B1 and B2 may be in the range of 200 to 700 degrees C., specifically 350 to 650 degrees C., more specifically 400 to 600 degrees C. Other processing conditions may be similar to the processing conditions in the above-described embodiments of the present disclosure. Also in these cases, the same effects as in the above-described embodiments may be obtained.

Further, for example, in the selective growth, it may be possible to form, for example, a metal oxide film such as an aluminum oxide film (AlO film), a titanium oxide film (TiO film), a hafnium oxide film (HfO film), a zirconium oxide film (ZrO film), a tantalum oxide film (TaO film), a molybdenum oxide film (MoO film), a tungsten oxide film (WO film) or the like, and a metal nitride film such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN film), a tungsten nitride film (WN film) or the like, as well as the silicon-based oxide film (silicon oxide film) such as a SiOC film, a SiO film, a SiON film, a SiOCN film or the like, and the silicon-based nitride film (silicon nitride film) such as a SiN film, a SiCN film or the like. In these cases, the film formation inhibition gas described above, the precursor gas containing metal elements such as Al, Ti, Hf, Zr, Ta, Mo, W, and the like as the film-forming gas described above, the reaction gas described above, and the halogen-free substance described above may be used, and the film formation inhibition layer formation, the selective growth, and the post-treatment may be performed according to the same processing procedures and processing conditions as those in the above-described embodiments and other embodiments of the present disclosure. Further, in these cases, as in the other embodiments described above, the supply of the catalyst gas may be omitted depending on the processing conditions. Further, in these cases, it is possible to obtain the same effects as in the above-described embodiments of the present disclosure.

The recipe used in each process may be provided separately according to the processing contents and may be stored in the memory 121c via an electric communication line or an external memory 123. When starting each process, the CPU 121a may properly select an appropriate recipe from a plurality of recipes stored in the memory 121c according to the contents of the processing. This makes it possible to form films of various film types, composition ratios, film qualities, and film thicknesses with high reproducibility in one substrate processing apparatus. Further, a burden on an operator may be reduced, and each process may be quickly started while avoiding operation errors.

The above-described recipes are not limited to the newly provided ones, but may be provided by, for example, changing the existing recipes already installed in the substrate processing apparatus. In the case of changing the recipes, the changed recipes may be installed in the substrate processing apparatus via an electric communication line or a recording medium in which the recipes are recorded. Further, the input/output device 122 included in the existing substrate processing apparatus may be operated to directly change the existing recipes already installed in the substrate processing apparatus.

In the above-described embodiments of the present disclosure, an example, in which a film is formed by using a batch-type substrate processing apparatus configured to process a plurality of substrates at a time, is described above. The present disclosure is not limited to the above-described embodiments, but may be suitably applied to, for example, a case where a film is formed by using a single-wafer-type substrate processing apparatus configured to process one or several substrates at a time. Further, in the above-described embodiments of the present disclosure, an example, in which a film is formed by using a substrate processing apparatus including a hot-wall-type process furnace, is described above. The present disclosure is not limited to the above-described embodiments but may also be suitably applied to a case where a film is formed by using a substrate processing apparatus including a cold-wall-type process furnace.

Even when these substrate processing apparatuses are used, each process may be performed under the same processing procedure and processing condition as those of the above-described embodiments of the present disclosure. The same effects as those of the above-described embodiments may be obtained.

In addition, the above-described embodiments and modifications may be used in combination as appropriate. In this case, processing procedures and processing conditions may be, for example, the same as the processing procedures and processing conditions of the above-described embodiments.

According to the present disclosure, it is possible to enhance a productivity while improving a film quality of a film formed by selective growth.

While certain embodiments are described above, these embodiments are presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) supplying a film formation inhibition gas to the substrate, which includes a first base and a second base on a surface of the substrate, to form a film formation inhibition layer on a surface of the first base;
   (b) supplying a film-forming gas to the substrate after forming the film formation inhibition layer on the surface of the first base, to form a film on a surface of the second base; and
   (c) supplying a halogen-free substance, which chemically reacts with the film formation inhibition layer and the film, to the substrate after forming the film on the surface of the second base, in a non-plasma atmosphere.

2. The method of claim 1, wherein step (c) is performed under a condition that enables a process of at least one selected from the group of removal and nullification of the film formation inhibition layer formed on the surface of the first base and a process of modifying the film formed on the surface of the second base.

3. The method of claim 2, wherein in step (c), impurities contained in the film are removed by the process of modifying the film.

4. The method of claim 2, wherein in step (c), a composition ratio of the film is changed by the process of modifying the film.

5. The method of claim 2, wherein in step (c), an element that is not contained in the film and is contained in the halogen-free substance is added into the film by the process of modifying the film.

6. The method of claim 2, wherein in step (c), the film formed on the surface of the second base is changed into a film that is different in chemical structure from the film formed on the surface of the second base by the process of modifying the film.

7. The method of claim 2, wherein in step (c), a portion of a surface of the film is changed into material that is different in chemical structure from the film by the process of modifying the film.

8. The method of claim 1, wherein in step (c), a process of at least one selected from the group of removal and nullification of the film formation inhibition layer formed on the surface of the first base or a process of modifying the film formed on the surface of the second base are performed simultaneously and in parallel by an action of the halogen-free substance.

9. The method of claim 1, wherein the halogen-free substance includes an oxidizing gas.

10. The method of claim 1, wherein the halogen-free substance includes one or more selected from the group of an oxygen-and hydrogen-containing gas, an oxygen-containing gas, and a mixed gas of the oxygen-containing gas and a hydrogen-containing gas.

11. The method of claim 1, wherein the halogen-free substance includes one or more selected from the group of $H_2O$, $H_2O_2$, $O_2$, $O_3$, $O_2+H_2$, $O_3+H_2$, $O_2+NH_3$, and $O_3+NH_3$.

12. The method of claim 1, wherein the halogen-free substance includes a nitriding gas.

13. The method of claim 1, wherein the halogen-free substance includes a nitrogen-and hydrogen-containing gas.

14. The method of claim 1, wherein the halogen-free substance includes one or more selected from the group of $NH_3$, $N_2H_4$, $N_2H_2$, and $N_3H_8$.

15. The method of claim 1, wherein a temperature of the substrate in step (c) is set to be equal to or higher than a temperature of the substrate in step (b).

16. The method of claim 1, wherein the film formation inhibition gas includes a hydrocarbon group-containing gas, and
   wherein hydrocarbon group terminations are formed on a surface of the film formation inhibition layer.

17. The method of claim 1, wherein the film formation inhibition gas includes a fluorine-containing gas, and
wherein fluorine terminations are formed on a surface of the film formation inhibition layer.

18. The method of claim 1, wherein in step (b), a precursor gas and a reaction gas are alternately supplied as the film-forming gas to the substrate, or the precursor gas and the reaction gas are alternately supplied as the film-forming gas to the substrate and a catalyst gas is supplied together with at least one selected from the group of the precursor gas and the reaction gas.

19. A method of manufacturing a semiconductor device, comprising:
 (a) supplying a film formation inhibition gas to a substrate, which includes a first base and a second base on a surface of the substrate, to form a film formation inhibition layer on a surface of the first base;
 (b) supplying a film-forming gas to the substrate after forming the film formation inhibition layer on the surface of the first base, to form a film on a surface of the second base; and
 (c) supplying halogen-free substance, which chemically reacts with the film formation inhibition layer and the film, to the substrate after forming the film on the surface of the second base, in a non-plasma atmosphere.

* * * * *